(12) United States Patent
Mitsuhashi et al.

(10) Patent No.: US 12,507,340 B2
(45) Date of Patent: Dec. 23, 2025

(54) RESIN FILM WITH CONDUCTOR LAYER, MULTILAYER SUBSTRATE, AND METHOD FOR PRODUCING RESIN FILM WITH CONDUCTOR LAYER

(71) Applicant: Murata Manufacturing Co., Ltd., Nagaokakyo (JP)

(72) Inventors: Mineto Mitsuhashi, Nagaokakyo (JP); Takeshi Eda, Nagaokakyo (JP); Taichi Furukawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 139 days.

(21) Appl. No.: 18/193,696

(22) Filed: Mar. 31, 2023

(65) Prior Publication Data

US 2023/0262876 A1    Aug. 17, 2023

Related U.S. Application Data

(63) Continuation of application No. PCT/JP2022/023160, filed on Jun. 8, 2022.

(30) Foreign Application Priority Data

Jun. 9, 2021    (JP) .................................. 2021-096549

(51) Int. Cl.
*H05K 1/02*    (2006.01)
*B32B 17/10*    (2006.01)

(52) U.S. Cl.
CPC ..... *H05K 1/0219* (2013.01); *B32B 17/10504* (2013.01); *B32B 2305/55* (2013.01);
(Continued)

(58) Field of Classification Search
CPC ...... H05K 1/024; H05K 1/0298; H05K 1/032; H05K 2201/0129; H05K 2201/0141;
(Continued)

(56) References Cited

U.S. PATENT DOCUMENTS 5,494,858 A * 2/1996 Gnade ............... H01L 21/02362
438/782
6,998,325 B2 * 2/2006 Yunogami ......... H01L 21/31695
438/692

(Continued)

FOREIGN PATENT DOCUMENTS

CN    206332152 U    7/2017
CN    112313057 A    2/2021
(Continued)

OTHER PUBLICATIONS

English Translation JP2003008233; Mitsuru et al., Published Jan. 10, 2003 (Year: 2003).*
(Continued)

*Primary Examiner* — Steven T Sawyer
(74) *Attorney, Agent, or Firm* — ArentFox Schiff LLP

(57) ABSTRACT

A laminate structure that includes: a resin film containing a thermoplastic resin and having a plurality of voids; and a conductor layer adjacent to a main surface of the resin film, wherein a first set of voids of the plurality of voids are localized between a first position proximal to an end surface of the resin film facing the conductor layer and a second position distant from the first position by one-third of the thickness of the resin film in a lamination direction of the resin film and the conductor layer such that the first set of voids between the first position and the second position are greater in number than a second set of voids between the second position and a third position distant from the second
(Continued)

position by one-third of the thickness of the resin film in a direction away from the first position in the lamination direction.

16 Claims, 7 Drawing Sheets

(52) U.S. Cl.
　　CPC ............... *H05K 2201/0116* (2013.01); *H05K 2201/0129* (2013.01); *H05K 2201/0141* (2013.01)

(58) Field of Classification Search
　　CPC ............... H05K 1/0326; H05K 1/0219; H05K 2201/0116; H05K 3/4632; C08J 5/18; C08J 2367/02; C09K 19/3809; C09K 2019/0448; Y02P 20/54; B32B 15/09; B32B 15/20; B32B 27/36
　　See application file for complete search history.

(56) References Cited

U.S. PATENT DOCUMENTS

| | | | |
|---|---|---|---|
| 9,960,471 B2 | 5/2018 | Baba et al. | |
| 10,986,728 B2 | 4/2021 | Xu et al. | |
| 11,659,658 B2 | 5/2023 | Xu et al. | |
| 2006/0148209 A1* | 7/2006 | Maruyama | H01L 23/49866 438/455 |
| 2009/0065240 A1 | 3/2009 | Onodera et al. | |
| 2017/0077579 A1 | 3/2017 | Baba et al. | |
| 2019/0363417 A1 | 11/2019 | Xu et al. | |
| 2021/0204403 A1 | 7/2021 | Xu et al. | |
| 2021/0268695 A1 | 9/2021 | Uchiyama et al. | |
| 2023/0183466 A1 | 6/2023 | Kuwajima et al. | |
| 2024/0076552 A9 | 3/2024 | Eda et al. | |

FOREIGN PATENT DOCUMENTS

| | | |
|---|---|---|
| JP | 2003008233 A | 1/2003 |
| JP | 2008-103559 A | 5/2008 |
| JP | 2018-109090 A | 7/2018 |
| JP | 2022-086176 A | 6/2022 |
| WO | 2015/186537 A1 | 12/2015 |
| WO | 2017110618 A1 | 6/2017 |
| WO | 2018/150926 A1 | 8/2018 |
| WO | 2020/218140 A1 | 10/2020 |
| WO | 2021059586 A1 | 4/2021 |
| WO | 2022/071527 A1 | 4/2022 |
| WO | 2022071525 A1 | 4/2022 |
| WO | 2022113591 A1 | 6/2022 |

OTHER PUBLICATIONS

English Translation WO2021059586; Taguchi, Published Apr. 1, 2021 (Year: 2021).*
International Search Report in PCT/JP2022/023160, mailed Aug. 2, 2022, 3 pages.
International Search Report in PCT/JP2022/023153, mailed Aug. 2, 2022, 3 pages.

* cited by examiner

RESIN FILM WITH CONDUCTOR LAYER, MULTILAYER SUBSTRATE, AND METHOD FOR PRODUCING RESIN FILM WITH CONDUCTOR LAYER

CROSS REFERENCE TO RELATED APPLICATIONS

The present application is a continuation of International application No. PCT/JP2022/023160, filed Jun. 8, 2022, which claims priority to Japanese Patent Application No. 2021-096549, filed Jun. 9, 2021, the entire contents of each of which are incorporated herein by reference.

FIELD OF THE INVENTION

The present invention relates to a resin film with a conductor layer, a multilayer substrate, and a method for producing a resin film with a conductor layer.

BACKGROUND OF THE INVENTION

As a multilayer substrate for use in various electronic devices, Patent Document 1 discloses a multilayer circuit board including a ground layer or a power supply layer and a signal layer with an insulating layer interposed therebetween, wherein the insulating layer is composed of a porous film with varying porosity in the thickness direction, and a surface with higher porosity of the porous film faces the signal layer.

Patent Document 1: Japanese Unexamined Patent Application Publication No. 2003-8233

SUMMARY OF THE INVENTION

In a multilayer substrate, such as a multilayer circuit board described in Patent Document 1, a technique of using a porous film for an insulating layer to reduce the permittivity of the insulating layer by an amount corresponding to the number of voids is sometimes used to improve dielectric properties in a high-frequency region. For example, in a multilayer circuit board described in Patent Document 1, as described in the examples of Patent Document 1, a porous film formed by a wet coagulation method using a film-forming stock solution containing a polyimide precursor followed by a heat treatment for heating and ring-closing of the polyimide precursor is used as an insulating layer.

To further improve the dielectric properties of a multilayer circuit board described in Patent Document 1 in a high-frequency region, the present inventors have studied the use of a thermoplastic resin, such as a liquid crystal polymer, as a constituent material of a porous film. When a thermoplastic resin is used to form a porous film by a method described in the examples of Patent Document 1, however, it has been found that the thermoplastic resin is sometimes easily decomposed or the shape of voids is sometimes difficult to maintain due to the viscoelasticity of the thermoplastic resin. Thus, it is difficult to form a porous film containing a thermoplastic resin in a multilayer circuit board described in Patent Document 1, and the multilayer circuit board has room for improvement in dielectric properties in a high-frequency region.

The present invention has been made to solve the above problems and aims to provide a resin film with a conductor layer that contains a thermoplastic resin and can have improved dielectric properties in a high-frequency region. The present invention also aims to provide a multilayer substrate including the resin film with the conductor layer. The present invention also aims to provide a method for producing the resin film with the conductor layer.

A laminate structure according to the present invention includes: a resin film containing a thermoplastic resin and having a plurality of voids therein; and a conductor layer adjacent to at least one main surface of the resin film, wherein a first set of voids of the plurality of voids in the resin film are localized between a first position and a second position such that the first set of voids between the first position and the second position are greater in number than a second set of voids of the plurality of voids between the second position and a third position, wherein the first position is proximal to an end surface of the resin film facing the conductor layer, the second position is distant from the first position by one-third of a thickness of the resin film in a lamination direction of the resin film and the conductor layer, and the third position is distant from the second position by one-third of the thickness of the resin film in a direction away from the first position in the lamination direction.

A multilayer substrate according to the present invention includes the laminate structure according to the present invention.

A method for producing a laminate structure according to the present invention includes: providing a conductor layer adjacent to at least one main surface of a resin film containing a thermoplastic resin to form a multilayer body including the resin film and the conductor layer in a lamination direction; and heat-treating the multilayer body to form a plurality of voids inside the resin film that are localized between a first position and a second position such that a first set of voids of the plurality of voids between the first position and the second position are greater in number than a second set of voids of the plurality of voids between the second position and a third position, wherein the first position is proximal to an end surface of the resin film facing the conductor layer, the second position is distant from the first position by one-third of a thickness of the resin film in the lamination direction, and the third position is distant from the second position by one-third of the thickness of the resin film in a direction away from the first position in the lamination direction.

The present invention can provide a resin film with a conductor layer that contains a thermoplastic resin and can have improved dielectric properties in a high-frequency region. The present invention can also provide a multilayer substrate including the resin film with the conductor layer. The present invention can also provide a method for producing the resin film with the conductor layer.

DETAILED DESCRIPTION OF THE PREFERRED EMBODIMENTS

A laminate structure according to the present invention, a multilayer substrate according to the present invention, and a method for producing a laminate structure according to the present invention are described below. The present invention is not limited to the following embodiments and may be modified as appropriate without departing from the gist of the present invention. The present invention also includes a combination of preferred embodiments described below.

A laminate structure according to the present invention includes: a resin film containing a thermoplastic resin and having a plurality of voids therein; and a conductor layer adjacent to at least one main surface of the resin film, wherein a first set of voids of the plurality of voids in the resin film are localized between a first position and a second position such that the first set of voids between the first position and the second position are greater in number than a second set of voids of the plurality of voids between the second position and a third position, wherein the first position is proximal to an end surface of the resin film facing the conductor layer, the second position is distant from the first position by one-third of a thickness of the resin film in a lamination direction of the resin film and the conductor layer, and the third position is distant from the second position by one-third of the thickness of the resin film in a direction away from the first position in the lamination direction.

Figure 1:
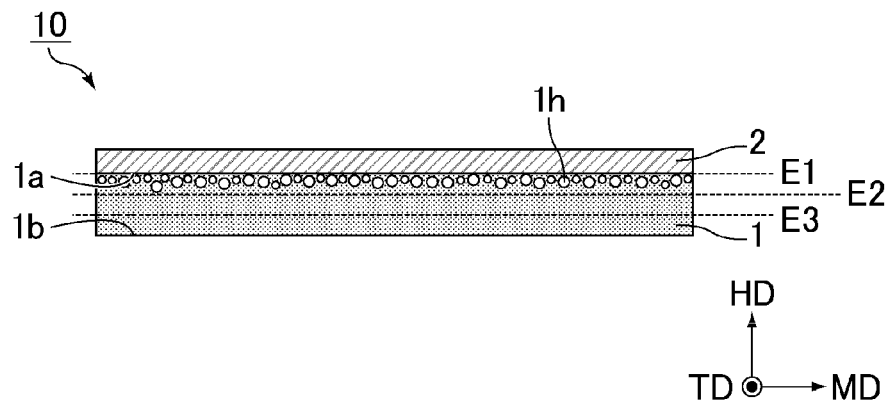
FIG. 1 is a schematic cross-sectional view of an example of a resin film with a conductor layer according to the present invention.

FIG. 1 is a schematic cross-sectional view of an example of a resin film with a conductor layer according to the present invention.

A resin film with a conductor layer 10 illustrated in FIG. 1 includes a resin film 1 and a conductor layer 2 in the lamination direction.

In the present description, a film is synonymous with a sheet and is not distinguished from a sheet due to the thickness.

In the present description, the lamination direction corresponds to the thickness direction of a resin film constituting a resin film with a conductor layer.

The resin film 1 has a first main surface 1a and a second main surface 1b facing each other in the thickness direction HD.

The resin film 1 preferably has a thickness of 10 μm to 250 μm.

An in-plane direction perpendicular to the thickness direction HD includes a first direction MD and a second direction TD. More specifically, the first direction MD is a direction perpendicular to the thickness direction HD, and the second direction TD is a direction perpendicular to the thickness direction HD and to the first direction MD. Thus, the thickness direction HD, the first direction MD, and the second direction TD are perpendicular to each other.

The conductor layer 2 is adjacent to at least one main surface of the resin film 1, that is, to the first main surface 1a in the present embodiment. More specifically, the conductor layer 2 is formed on the first main surface 1a of the resin film 1.

A constituent material of the conductor layer 2 is, for example, copper, silver, aluminum, stainless steel, nickel, gold, or an alloy containing at least one of these metals.

The conductor layer 2 is formed of, for example, metal foil, preferably copper foil. A metal other than copper may be present on the surface of the copper foil.

The resin film 1 contains a thermoplastic resin.

Examples of the thermoplastic resin contained in the resin film 1 include liquid crystal polymers (LCP), fluoropolymers, thermoplastic polyimide resins, poly(ether ether ketone) resins (PEEK), poly(phenylene sulfide) resins (PPS), cyclic polyolefin resins (COP), and poly(phenylene ether) resins (PPE).

The thermoplastic resin contained in the resin film 1 is preferably a liquid crystal polymer. In other words, the resin film 1 is preferably a liquid crystal polymer film. Among thermoplastic resins, liquid crystal polymers have low permittivity and hygroscopicity. Thus, a multilayer substrate produced by using a liquid crystal polymer film tends to have the effects of the liquid crystal polymer, such as improved dielectric properties in a high-frequency region and smaller changes in dielectric properties due to moisture absorption.

In the production of a multilayer substrate using a liquid crystal polymer film and a conductor layer, for example, when a via-hole extending through the liquid crystal polymer film is plated to form an interlayer connection conductor connected to the conductor layer, a stress applied from the liquid crystal polymer film may cause a crack in the interlayer connection conductor. Likewise, when a multilayer substrate is produced by a simultaneous lamination method using a liquid crystal polymer film with a conductor layer having a via-hole filled with an electrically conductive paste, a stress applied from the liquid crystal polymer film may cause a crack in an interlayer connection conductor, which is a solidified product of the electrically conductive paste. Consequently, a multilayer substrate produced by using a liquid crystal polymer film may have an interlayer connection conductor with lower connection reliability.

When the resin film 1 is a liquid crystal polymer film, in a $^{13}$C-NMR spectrum of the resin film 1 decomposed with supercritical methanol, an integral value CA of a peak derived from a benzene ring, an integral value CB of a peak derived from a naphthalene ring, and an integral value CC of a peak derived from a carboxymethyl group preferably satisfy (CA+CB)/CC of 1.25 to 1.65.

A liquid crystal polymer film with (CA+CB)/CC of 1.65 or less can have a lower coefficient of linear expansion in the thickness direction. Furthermore, a liquid crystal polymer film with (CA+CB)/CC of 1.25 or more can be easily processed and tends to have improved processability in the production of a multilayer substrate. A liquid crystal polymer film with (CA+CB)/CC of 1.25 to 1.65 can therefore have a lower coefficient of linear expansion in the thickness direction, can be easily processed, and tends to have improved processability in the production of a multilayer substrate.

When a liquid crystal polymer film with (CA+CB)/CC of 1.25 to 1.65 is used to produce a multilayer substrate with an interlayer connection conductor, due to a low coefficient of linear expansion of the liquid crystal polymer film in the thickness direction, stress is less likely to be applied from the liquid crystal polymer film to the interlayer connection conductor. Thus, a multilayer substrate produced using a liquid crystal polymer film with (CA+CB)/CC of 1.25 to 1.65 is less likely to have a crack in an interlayer connection conductor, and the interlayer connection conductor is consequently less likely to have low connection reliability.

Furthermore, when a multilayer substrate is produced by a simultaneous lamination method using a liquid crystal polymer film with (CA+CB)/CC of 1.25 to 1.65, it is not necessary to increase the hot-pressing temperature, so that the liquid crystal polymer is less likely to be decomposed during the hot pressing.

A liquid crystal polymer film with (CA+CB)/CC of less than 1.25 is composed of a hard constituent material, is difficult to deform, and is sometimes difficult to process. Furthermore, such a liquid crystal polymer film may have low processability in the production of a multilayer substrate.

A liquid crystal polymer film with (CA+CB)/CC of more than 1.65 has a high coefficient of linear expansion in the thickness direction. Thus, a multilayer substrate with an interlayer connection conductor produced using such a liquid crystal polymer film may have an interlayer connection conductor with low connection reliability.

The liquid crystal polymer film preferably has (CA+CB)/CC of 1.35 to 1.65.

(CA+CB)/CC is determined as described below.

First, a conductor layer of a liquid crystal polymer film with the conductor layer is etched to take out the liquid crystal polymer film. Alternatively, a liquid crystal polymer film with a conductor layer is taken out from a multilayer substrate including the liquid crystal polymer film with the conductor layer, and the conductor layer of the liquid crystal polymer film with the conductor layer taken out is then etched to take out the liquid crystal polymer film.

The liquid crystal polymer film and methanol are then put into a high-temperature and high-pressure reactor. The high-temperature and high-pressure reactor is purged with argon and is then heated to prepare a solution of the liquid crystal polymer film. For a high-temperature and high-pressure reactor of a closed system, only heating the system, for example, to 240° C. or more vaporizes methanol, pressurizes the system to the critical pressure of methanol, and brings the methanol in the system to a supercritical state. The solution is then dried under vacuum to remove the solvent and prepare a powder of a decomposition product of the liquid crystal polymer film decomposed with the supercritical methanol. The powder of the decomposition product of the liquid crystal polymer film is then dissolved in deuterated methanol, for example, at a ratio of 0.02 g per milliliter of deuterated methanol to prepare an NMR measurement sample.

The NMR measurement sample is then subjected to NMR measurement to obtain a $^{13}$C-NMR spectrum. An integral value CA of a peak derived from a benzene ring, an integral value CB of a peak derived from a naphthalene ring, and an integral value CC of a peak derived from a carboxymethyl group are then determined from the $^{13}$C-NMR spectrum.

When a liquid crystal polymer constituting a liquid crystal polymer film contains only a type II wholly aromatic polyester, a peak derived from a benzene ring, more specifically, a peak derived from methyl p-hydroxybenzoate corresponds to a peak with a chemical shift of 113 ppm to 115 ppm (114±1 ppm). A peak derived from a naphthalene ring, more specifically, a peak of methyl 6-hydroxy-2-naphthoate corresponds to a peak with a chemical shift of 107 ppm to 109 ppm (108±1 ppm). A peak derived from a carboxymethyl group, more specifically, a peak of a methyl group derived from an ester corresponds to a peak with a chemical shift of 49 ppm to 51 ppm (50±1 ppm).

(CA+CB)/CC is calculated from CA, CB, and CC thus determined.

Alternatively, CA, CB, and CC may be determined as converted values based on the integral value of a peak derived from deuterated methanol, which is taken as 100, and (CA+CB)/CC may be calculated from CA, CB, and CC.

(CA+CB)/CC is controlled, for example, by using a plurality of wholly aromatic polyesters with different monomer primary structures as liquid crystal polymers and adjusting the blending ratio of these liquid crystal polymers in the production of a liquid crystal polymer film. Alternatively, a liquid crystal polymer having a monomer primary structure with (CA+CB)/CC of 1.25 to 1.65 may be used in the production of a liquid crystal polymer film.

Further effects of a liquid crystal polymer film with (CA+CB)/CC of 1.25 to 1.65 are described below.

Although one known method for decreasing the coefficient of linear expansion of a liquid crystal polymer film in the thickness direction is a method of forming a film using a liquid crystal polymer with a low coefficient of volume expansion in the production of the liquid crystal polymer film, the following method may also be used.

Another known method may be a method of forming a film by using a mixed resin of a liquid crystal polymer and inorganic filler in the production of a liquid crystal polymer film.

However, inorganic filler has an active surface, and water is easily adsorbed on the surface of the inorganic filler. A multilayer substrate produced by using a liquid crystal polymer film containing inorganic filler therefore tends to have variable dielectric properties due to moisture absorption. Although the surface of inorganic filler is sometimes treated with a coupling agent or the like to reduce the activity of the surface of the inorganic filler, such surface treatment cannot sufficiently reduce the adsorption of water on the surface of the inorganic filler. Furthermore, a liquid crystal polymer film containing inorganic filler tends to have a low elongation at break.

A liquid crystal polymer film with (CA+CB)/CC of 1.65 or less can have a lower coefficient of linear expansion in the thickness direction. In other words, a liquid crystal polymer film with (CA+CB)/CC of 1.65 or less does not necessarily contain inorganic filler to decrease the coefficient of linear expansion in the thickness direction. Thus, a liquid crystal polymer film with a conductor layer including a liquid crystal polymer film with (CA+CB)/CC of 1.65 or less and a multilayer substrate including the liquid crystal polymer film with the conductor layer have smaller changes in dielectric properties due to moisture absorption. Furthermore, the liquid crystal polymer film is less likely to have a lower elongation at break.

Still another known method includes irradiating a liquid crystal polymer film with ionizing radiation to cross-link the liquid crystal polymer.

However, irradiating a liquid crystal polymer film with a high dose of ionizing radiation to decrease the coefficient of linear expansion of the liquid crystal polymer film in the thickness direction increases the production costs of the liquid crystal polymer film.

On the other hand, a liquid crystal polymer film with (CA+CB)/CC of 1.65 or less can have a lower coefficient of linear expansion in the thickness direction. In other words, the production of a liquid crystal polymer film with (CA+CB)/CC of 1.65 or less does not necessarily require a high dose of ionizing radiation to decrease the coefficient of linear expansion in the thickness direction. This can reduce the production costs of the liquid crystal polymer film.

In a $^{13}$C-NMR spectrum of an NMR measurement sample prepared by dissolving a powder of a decomposition product of a liquid crystal polymer film decomposed with supercritical methanol in deuterated methanol at a ratio of 0.02 g per milliliter of deuterated methanol, when the integral value of a peak derived from deuterated methanol is 100, CA is preferably 1.05 to 1.80.

In a liquid crystal polymer film, CA of less than 1.05 under the above conditions may result in a high storage elastic modulus.

In a liquid crystal polymer film, CA of more than 1.80 under the above conditions may result in a high coefficient of linear expansion in the thickness direction.

In a $^{13}$C-NMR spectrum of an NMR measurement sample prepared by dissolving a powder of a decomposition product of a liquid crystal polymer film decomposed with supercritical methanol in deuterated methanol at a ratio of 0.02 g per milliliter of deuterated methanol, when the integral value of a peak derived from deuterated methanol is 100, CB is preferably 1.20 to 1.70.

In a liquid crystal polymer film, CB of less than 1.20 under the above conditions may result in a high coefficient of linear expansion in the thickness direction.

In a liquid crystal polymer film, CB of more than 1.70 under the above conditions may result in a high storage elastic modulus.

In a $^{13}$C-NMR spectrum of an NMR measurement sample prepared by dissolving a powder of a decomposition product of a liquid crystal polymer film decomposed with supercritical methanol in deuterated methanol at a ratio of 0.02 g per milliliter of deuterated methanol, when the integral value of a peak derived from deuterated methanol is 100, CC is preferably 1.60 to 2.50.

In a liquid crystal polymer film, CC of less than 1.60 under the above conditions may result in a high storage elastic modulus.

In a liquid crystal polymer film, CC of more than 2.50 under the above conditions may result in a high coefficient of linear expansion in the thickness direction.

A peak derived from deuterated methanol corresponds to a peak with a chemical shift of 47 ppm to 48 ppm (47.5±0.5 ppm).

The resin film 1 has voids 1h inside.

In the resin film with the conductor layer 10, the voids 1h in the resin film 1 reduce the permittivity of the resin film 1. Consequently, a multilayer substrate produced using the resin film with the conductor layer 10 has improved dielectric properties in a high-frequency region. Furthermore, when the resin film 1 is a liquid crystal polymer film, also due to the effects of the liquid crystal polymer, the multilayer substrate has significantly improved dielectric properties in a high-frequency region.

In the resin film with the conductor layer 10, the voids 1h in the resin film 1 are localized between a first position E1 and a second position E2 such that voids between the first position E1 and the second position E2 are greater in number than voids between the second position E2 and a third position E3, wherein the first position E1 refers to a position of an end surface, that is, the first main surface 1a of the resin film 1 facing the conductor layer 2, the second position E2 refers to a position distant from the first position E1 by one-third of the thickness of the resin film 1 in the lamination direction, and the third position E3 refers to a position distant from the second position E2 by one-third of the thickness of the resin film 1 in a direction away from the first position E1 in the lamination direction.

In the resin film with the conductor layer 10, the voids 1h in the resin film 1 are localized between the first position E1 and the second position E2 as described above and are localized near the conductor layer 2. In a multilayer substrate produced using the resin film with the conductor layer 10, when the conductor layer 2 is a signal line for transmitting a signal, the voids 1h localized near the conductor layer 2 or near the signal line reduce permittivity in the vicinity of the signal line, easily reduce transmission loss in a high-frequency region, and consequently tend to improve transmission characteristics in the high-frequency region.

In the present description, the second position in the resin film is defined by a plane extending in the in-plane direction perpendicular to the lamination direction at a position distant from the interface between the resin film and the conductor layer at the first position by one-third of the thickness of the resin film that overlaps the conductor layer in the lamination direction.

In the present description, the third position in the resin film is defined by a plane extending in the in-plane direction perpendicular to the lamination direction at a position distant from the second position by one-third of the thickness of the resin film used to define the second position in a direction away from the first position in the lamination direction.

The number of voids between the first position and the second position is determined as described below. First, the region of voids in a resin film of the resin film with a conductor layer or in a resin film of a multilayer substrate including the resin film with a conductor layer as described later is determined in advance by viewing the resin film in the thickness direction. The region between the first position and the second position is then viewed in cross section in the in-plane direction, and an image of a cross section in the thickness direction is taken with a scanning electron microscope (SEM). In this manner, cross-sectional images of the region between the first position and the second position in the resin film are taken at five to ten different positions in the in-plane direction. The size of one cross-sectional image is 75 µm in length×125 µm in width (for example, the size of a field viewed at a magnification of 1000 times). All the captured cross-sectional images are subjected to image analysis using image analysis software to count all the voids in all the cross-sectional images. The average value in one cross-sectional image (one field) calculated from the total number of voids is defined as the number of voids between the first position and the second position.

The number of voids between the second position and the third position is also defined in the same manner as the number of voids between the first position and the second position. When voids cannot be observed in all the cross-sectional images (cross-sectional images at five to ten positions) taken in the region between the second position and the third position in the resin film, the number of voids between the second position and the third position is considered to be zero.

The phrase "voids are localized between the first position and the second position", as used herein, means that, unlike a multilayer circuit board described in Patent Document 1 (see FIG. 1 of Patent Document 1), the number of voids between the first position and the second position is extremely greater than the number of voids between the second position and the third position and preferably means that the number of voids between the second position and the third position is one-fifth or less of the number of voids between the first position and the second position.

The voids $1h$ in the resin film 1 are preferably localized between the first position E1 and a fourth position (not shown) such that voids between the first position E1 and the fourth position is greater in number than voids between the fourth position and a fifth position (not shown), wherein the fourth position refers to a position distant from the first position E1 by one-fourth of the thickness of the resin film 1 in the lamination direction, and the fifth position refers to a position distant from the fourth position by one-fourth of the thickness of the resin film 1 in a direction away from the first position E1 in the lamination direction. In this case, a multilayer substrate produced using the resin film with the conductor layer 10 can more easily have improved transmission characteristics in a high-frequency region.

On the other hand, the voids $1h$ not localized between the first position E1 and the second position E2 but present throughout the entire resin film 1 in the thickness direction HD reduce the mechanical strength of the resin film 1 and consequently reduce the mechanical strength of the resin film with the conductor layer 10. From this perspective, the voids $1h$ are preferably not substantially present between the second position E2 and the third position E3. The phrase "voids are not substantially present between the second position and the third position" means that the number of voids between the second position and the third position is 5 or less, preferably 3 or less.

As illustrated in FIG. 1, the voids $1h$ may be present only between the first position E1 and the second position E2.

As described above, the resin film with the conductor layer 10 can be a resin film with a conductor layer that contains a thermoplastic resin and can have improved dielectric properties in a high-frequency region.

The voids $1h$ between the first position E1 and the second position E2 preferably have a diameter of 20 µm or less.

The voids $1h$ with a diameter of 20 µm or less are less likely to reduce the mechanical strength of the resin film 1 and consequently of the resin film with the conductor layer 10.

On the other hand, the voids $1h$ localized near the conductor layer 2 may reduce the adhesion between the resin film 1 and the conductor layer 2. Even localized near the conductor layer 2, however, the voids $1h$ with a diameter of 20 µm or less are less likely to reduce the adhesion between the resin film 1 and the conductor layer 2.

The voids $1h$ with a diameter of more than 20 µm may reduce the mechanical strength of the resin film 1 and consequently reduce the mechanical strength of the resin film with the conductor layer 10. The voids $1h$ with a diameter of more than 20 µm may reduce the adhesion between the resin film 1 and the conductor layer 2.

The voids $1h$ preferably have a diameter of 5 µm or more.

For a certain porosity, the number of voids $1h$ required is greater in voids $1h$ with a diameter of less than 5 µm than in voids $1h$ with a diameter of 5 µm or more. When a resin film with a conductor layer or a multilayer substrate including a resin film with a conductor layer is bent, therefore, voids $1h$ with a diameter of less than 5 µm may cause a crack and consequently reduce the mechanical strength of the resin film with the conductor layer or of the multilayer substrate including the resin film with the conductor layer.

The diameter of voids between the first position and the second position is determined as described below. First, the region of voids in a resin film of the resin film with a conductor layer or in a resin film of a multilayer substrate including the resin film with a conductor layer as described later is determined in advance by viewing the resin film in the thickness direction. The region between the first position and the second position is then viewed in cross section in the in-plane direction, and an image of a cross section in the thickness direction is taken with a scanning electron microscope. In this manner, cross-sectional images of the region between the first position and the second position in the resin film are taken at five to ten different positions in the in-plane direction. The size of one cross-sectional image is 75 µm in length×125 µm in width (for example, the size of a field viewed at a magnification of 1000 times). All the captured cross-sectional images are subjected to image analysis using image analysis software to determine the equivalent circular diameter of each void in all the cross-sectional images. The maximum value of the diameters thus determined is defined as the diameter of the voids present between the first position and the second position.

In the viscoelastic properties showing the relationship between the loss tangent and the temperature of the resin film 1, the integral value of the loss tangent in the temperature range of 40° C. to the melting point of the thermoplastic resin contained in the resin film is preferably 29.7 or less.

The integral value of the loss tangent in the temperature range of 40° C. to the melting point of the thermoplastic resin contained in the resin film is determined as described below. First, a conductor layer of a resin film with the conductor layer is etched to take out the resin film. Alternatively, a resin film with a conductor layer is taken out from a multilayer substrate including the resin film with the conductor layer as described later, and the conductor layer of the resin film with the conductor layer taken out is then etched to take out the resin film. A graph of the relationship between the loss tangent and the temperature of the resin film was then obtained by measuring the temperature dependence of the loss tangent of the resin film with a dynamic viscoelastometer at least in the temperature range of 40° C. to the melting point of the thermoplastic resin contained in the resin film. The integral value of loss tangent is calculated by integration from the graph of the relationship between the loss tangent and the temperature of the resin film in the temperature range of 40° C. to the melting point of the thermoplastic resin contained in the resin film.

The melting point of the thermoplastic resin contained in the resin film is determined as described below. First, the resin film is completely melted by heating with a differential scanning calorimeter. The melt is then cooled and is then heated again. The temperature of an endothermic peak observed during the heating is defined as the melting point of the thermoplastic resin contained in the resin film. When it is difficult to observe an endothermic peak by this method, the melting point of the thermoplastic resin contained in the resin film is determined by texture observation with a polarizing microscope under crossed nicols conditions.

When the integral value of the loss tangent of the resin film 1 under the above conditions is 29.7 or less, the resin film 1 has a small viscosity component of loss tangent in viscoelastic properties and is not easily softened even at high temperatures. The effects of the resin film 1 with such characteristics are described below with reference to an example of a method for producing the resin film with the conductor layer 10 illustrated in FIG. 1.

A method for producing a laminate structure according to the present invention includes: providing a conductor layer adjacent to at least one main surface of a resin film containing a thermoplastic resin to form a multilayer body including the resin film and the conductor layer in a lamination direction; and heat-treating the multilayer body to form a plurality of voids inside the resin film that are localized between a first position and a second position such that a first set of voids of the plurality of voids between the first position and the second position are greater in number than a second set of voids of the plurality of voids between the second position and a third position, wherein the first position is proximal to an end surface of the resin film facing the conductor layer, the second position is distant from the first position by one-third of a thickness of the resin film in the lamination direction, and the third position is distant from the second position by one-third of the thickness of the resin film in a direction away from the first position in the lamination direction.

<Step of Producing Multilayer Body>

Figure 2:
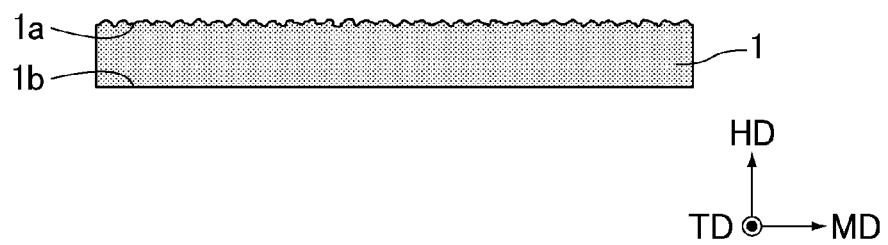
FIG. 2 is a schematic cross-sectional view of the step of producing a multilayer body in an example of a method for producing a resin film with a conductor layer according to the present invention.
Figure 3:
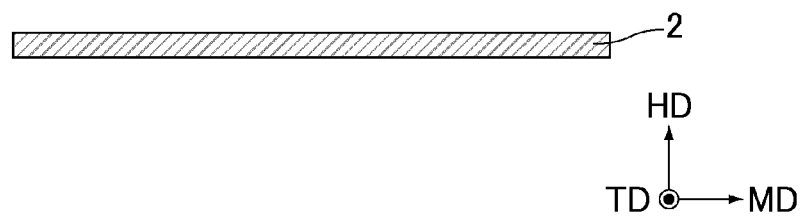
FIG. 3 is a schematic cross-sectional view of the step of producing a multilayer body in an example of a method for producing a resin film with a conductor layer according to the present invention.
Figure 4:
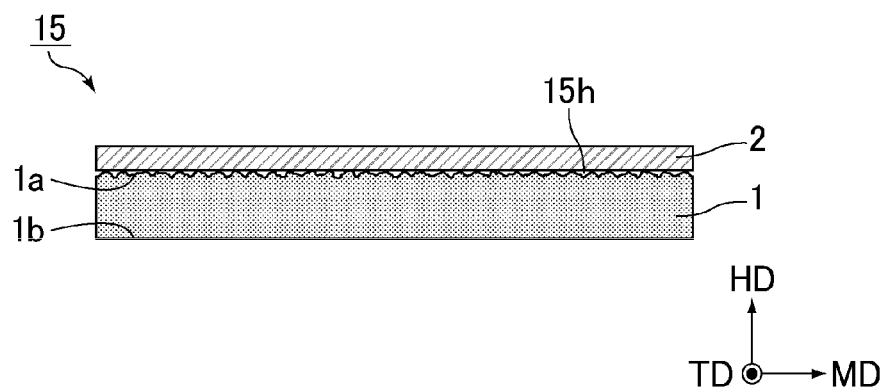
FIG. 4 is a schematic cross-sectional view of the step of producing a multilayer body in an example of a method for producing a resin film with a conductor layer according to the present invention.

FIGS. 2, 3, and 4 are schematic cross-sectional views of the step of producing a multilayer body in an example of a method for producing a resin film with a conductor layer according to the present invention.

First, as illustrated in FIG. 2, the resin film 1 containing the thermoplastic resin is prepared. As illustrated in FIG. 2, the first main surface 1a of the resin film 1 is not a completely flat surface but a rough surface with irregularities.

The resin film 1, for example, a liquid crystal polymer film is prepared from a resin material containing a liquid crystal polymer by a known method as described in Japanese Unexamined Patent Application Publication No. 2-3430. The resin film 1, for example, a liquid crystal polymer film is industrially advantageously formed by a T-die forming and stretching method, a laminate stretching method, an inflation method, or the like.

As illustrated in FIG. 3, the conductor layer 2 is prepared.

As illustrated in FIG. 4, the conductor layer 2 is placed adjacent to at least one main surface of the resin film 1, that is, to the first main surface 1a, thereby preparing a multilayer body 15 including the resin film 1 and the conductor layer 2 in the lamination direction. At this time, for example, the conductor layer 2 is pressure-bonded to the first main surface 1a of the resin film 1.

In the multilayer body 15, because the first main surface 1a of the resin film 1 is a rough surface, there is a space 15h between the resin film 1 and the conductor layer 2 in the in-plane direction.

In the step of producing the multilayer body, the main surface of the resin film 1 on which the conductor layer 2 is placed, that is, the first main surface 1a preferably has an arithmetic mean height Sa of 240 nm or more.

When the main surface of the resin film 1 on which the conductor layer 2 is placed, that is, the first main surface 1a has an arithmetic mean height Sa of 240 nm or more, the space 15h is easily and more widely formed between the resin film 1 and the conductor layer 2. Consequently, in the step of forming voids described later, voids are easily and more widely formed from the space 15h in the resin film 1 near the conductor layer 2. This tends to increase the number of voids in the resin film 1 near the conductor layer 2 in a resin film with a conductor layer to be formed later.

In the step of producing the multilayer body, the main surface of the resin film 1 on which the conductor layer 2 is placed, that is, the first main surface 1a preferably has an arithmetic mean height Sa of 350 nm or less.

The arithmetic mean height Sa of the main surface of the resin film on which the conductor layer is to be provided is determined as described below. First, an image of the main surface of the resin film on which the conductor layer is to be provided is taken in nine fields with a non-contact laser microscope at a magnification of 20 times. All the captured images are subjected to image analysis using image analysis software to determine the arithmetic mean height Sa of the main surface of the resin film in each image. The maximum value of the measured values is defined as the arithmetic mean height Sa of the main surface of the resin film on which the conductor layer is to be provided.

<Step of Forming Voids>

The multilayer body 15 is heat-treated to form voids in the resin film 1. When the multilayer body 15 is heat-treated, the resin film 1 flows and takes in the space 15h. Consequently, voids are formed from the space 15h inside the resin film 1. More specifically, as illustrated in FIG. 1, the voids 1h in the resin film 1 are localized between a first position E1 and a second position E2 such that voids between the first position E1 and the second position E2 are greater in number than voids between the second position E2 and a third position E3, wherein the first position E1 refers to a position of an end surface, that is, the first main surface 1a of the resin film 1 facing the conductor layer 2, the second position E2 refers to a position distant from the first position E1 by one-third of the thickness of the resin film 1 in the lamination direction, and the third position E3 refers to a position distant from the second position E2 by one-third of the thickness of the resin film 1 in a direction away from the first position E1 in the lamination direction.

Thus, the resin film with the conductor layer 10 illustrated in FIG. 1 is produced.

As described above, when the integral value of the loss tangent in the temperature range of 40° C. to the melting point of the thermoplastic resin is 29.7 or less in the viscoelastic properties showing the relationship between the loss tangent and the temperature of the resin film 1, the resin film 1 has a small viscosity component of loss tangent in the viscoelastic properties and is not easily softened even at high temperatures. The resin film 1 with such characteristics is not easily softened and easily maintains the shape of the irregularities on the first main surface 1a of the resin film 1. Thus, even when the multilayer body 15 is heat-treated in the step of forming voids, the gas contained in the space 15h originating from the irregularities on the first main surface 1a of the resin film 1 is rarely released to the outside of the resin film 1. Consequently, the gas contained in the space 15h is easily taken into the resin film 1, and, as illustrated in FIG. 1, the voids 1h are easily formed in the resin film 1, more specifically, near the conductor layer 2.

In a resin film with a conductor layer according to the present invention, the conductor layer may have a planar shape as in the resin film with the conductor layer 10 illustrated in FIG. 1 or may have a pattern, such as a wire.

Figure 5:
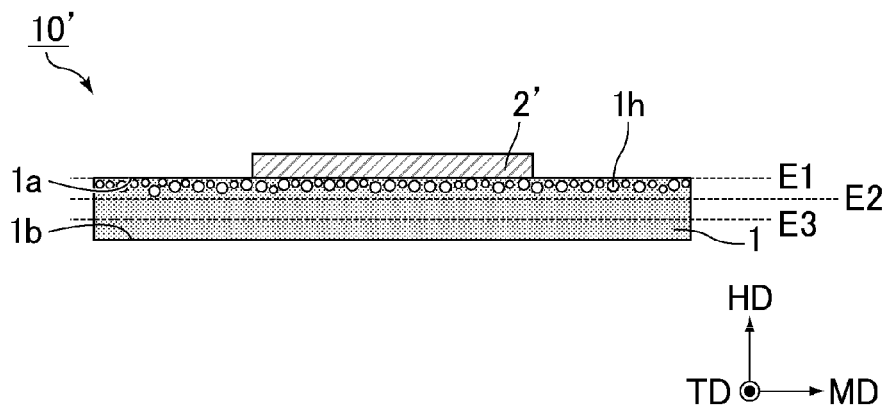
FIG. 5 is a schematic cross-sectional view of an example of a resin film with a conductor layer according to the present invention, which is different from the example of FIG. 1.

FIG. 5 is a schematic cross-sectional view of an example of a resin film with a conductor layer according to the present invention, which is different from the example of FIG. 1.

A resin film with a conductor layer 10' illustrated in FIG. 5 includes the resin film 1 and a conductor layer 2' in the lamination direction.

The conductor layer 2' is adjacent to the first main surface 1a of the resin film 1. More specifically, the conductor layer 2' is formed on part of the first main surface 1a of the resin film 1.

The conductor layer 2' is formed, for example, by pressure-bonding a conductor layer to the first main surface 1a of the resin film 1 and then patterning the conductor layer by etching. The conductor layer 2' may also be formed by pressure-bonding a patterned conductor layer to the first main surface 1a of the resin film 1.

In the resin film with the conductor layer 10', the voids 1h in the resin film 1 are localized between a first position E1 and a second position E2 such that voids between the first position E1 and the second position E2 are greater in number than voids between the second position E2 and a third position E3, wherein the first position E1 refers to a position of an end surface, that is, the first main surface 1a of the resin film 1 facing the conductor layer 2', the second position E2 refers to a position distant from the first position E1 by one-third of the thickness of the resin film 1 in the lamination direction, and the third position E3 refers to a position distant from the second position E2 by one-third of the thickness of the resin film 1 in a direction away from the first position E1 in the lamination direction.

In the resin film with the conductor layer 10', the voids 1h are present in the first main surface 1a of the resin film 1 not only near the conductor layer 2' but also near the region where the conductor layer 2' is not formed. Thus, in the resin film with the conductor layer 10', the voids 1h are present not only in the region overlapping the conductor layer 2' when viewed in the thickness direction HD but also in the region not overlapping the conductor layer 2' when viewed in the thickness direction HD.

A resin film with a conductor layer according to the present invention may have a conductor layer adjacent to only one main surface of the resin film as in the resin film with the conductor layer 10 illustrated in FIG. 1 or may have another conductor layer adjacent to the other main surface of the resin film in addition to the conductor layer adjacent to the one main surface of the resin film.

Figure 6:
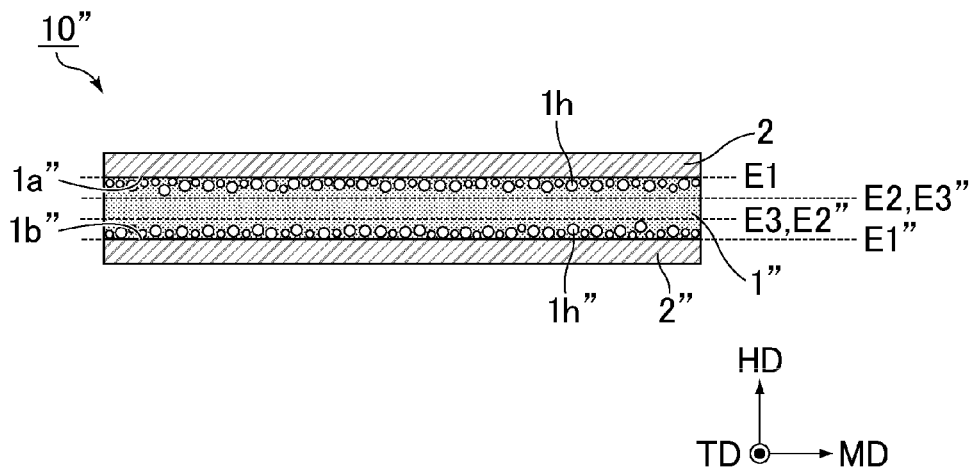
FIG. 6 is a schematic cross-sectional view of an example of a resin film with a conductor layer according to the present invention, which is different from the examples of FIGS. 1 and 5.

FIG. 6 is a schematic cross-sectional view of an example of a resin film with a conductor layer according to the present invention, which is different from the examples of FIGS. 1 and 5.

A resin film with a conductor layer 10" illustrated in FIG. 6 includes a resin film 1", the conductor layer 2, and a conductor layer 2" in the lamination direction.

The resin film 1" has a first main surface 1a" and a second main surface 1b" facing each other in the thickness direction HD.

The conductor layer 2 is adjacent to the first main surface 1a" of the resin film 1". More specifically, the conductor layer 2 is formed on the first main surface 1a" of the resin film 1".

The conductor layer 2" is adjacent to the second main surface 1b" of the resin film 1". More specifically, the conductor layer 2" is formed on the second main surface 1b" of the resin film 1".

The resin film 1" contains a thermoplastic resin.

The resin film 1" has voids 1h inside.

In the resin film with the conductor layer 10", the voids 1h in the resin film 1" are localized between a first position E1 and a second position E2 such that voids between the first position E1 and the second position E2 are greater in number than voids between the second position E2 and a third position E3, wherein the first position E1 refers to a position of an end surface, that is, the first main surface 1a" of the resin film 1" facing the conductor layer 2, the second position E2 refers to a position distant from the first position E1 by one-third of the thickness of the resin film 1" in the lamination direction, and the third position E3 refers to a position distant from the second position E2 by one-third of the thickness of the resin film 1" in a direction away from the first position E1 in the lamination direction. Thus, in the resin film with the conductor layer 10", the voids 1h are localized near the conductor layer 2.

In the resin film with the conductor layer 10", the resin film 1" includes voids 1h" in addition to the voids 1h. In the resin film with the conductor layer 10", the voids 1h" in the resin film 1" are localized between a first position E1" and a second position E2" such that voids between the first position E1" and the second position E2" are greater in number than voids between the second position E2" and a third position E3", wherein the first position E1" refers to a position of an end surface, that is, the second main surface 1b" of the resin film 1" facing the conductor layer 2", the second position E2" refers to a position distant from the first position E1" by one-third of the thickness of the resin film 1" in the lamination direction, and the third position E3" refers to a position distant from the second position E2" by one-third of the thickness of the resin film 1" in a direction away from the first position E1" in the lamination direction. Thus, in the resin film with the conductor layer 10", the voids 1h" are localized near the conductor layer 2".

A multilayer substrate according to the present invention includes a resin film with a conductor layer according to the present invention.

Figure 7:
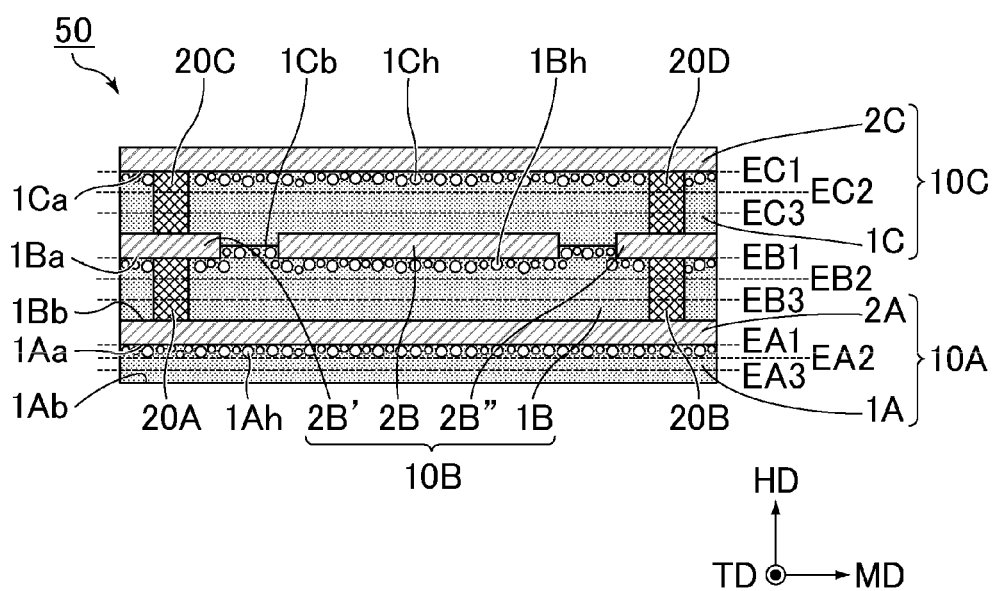
FIG. 7 is a schematic cross-sectional view of an example of a multilayer substrate according to the present invention.

FIG. 7 is a schematic cross-sectional view of an example of a multilayer substrate according to the present invention.

A multilayer substrate 50 illustrated in FIG. 7 includes a resin film with a conductor layer 10A, a resin film with a conductor layer 10B, and a resin film with a conductor layer 10C in order in the lamination direction. Thus, in the multilayer substrate 50, the resin film with the conductor layer 10A, the resin film with the conductor layer 10B, and the resin film with the conductor layer 10C are laminated in order in the lamination direction.

The resin film with the conductor layer 10A includes a resin film 1A and a conductor layer 2A.

The resin film 1A has a first main surface 1Aa and a second main surface 1Ab facing each other in the thickness direction HD.

The conductor layer 2A is adjacent to the first main surface 1Aa of the resin film 1A. The conductor layer 2A is also adjacent to a second main surface 1Bb of a resin film 1B described later.

The resin film 1A contains a thermoplastic resin.

The resin film 1A has voids 1Ah inside.

In the resin film with the conductor layer 10A, the voids 1Ah in the resin film 1A are localized between a first position EA1 and a second position EA2 such that voids between the first position EA1 and the second position EA2 are greater in number than voids between the second position EA2 and a third position EA3, wherein the first position EA1 refers to a position of an end surface, that is, the first main surface 1Aa of the resin film 1A facing the conductor layer 2A, the second position EA2 refers to a position distant from the first position EA1 by one-third of the thickness of the resin film 1A in the lamination direction, and the third position EA3 refers to a position distant from the second position EA2 by one-third of the thickness of the resin film 1A in a direction away from the first position EA1 in the lamination direction. Thus, in the resin film with the conductor layer 10A, the voids 1Ah are localized near the conductor layer 2A.

The resin film with the conductor layer 10B includes a resin film 1B, a conductor layer 2B, a conductor layer 2B', and a conductor layer 2B''.

The resin film 1B has a first main surface 1Ba and a second main surface 1Bb facing each other in the thickness direction HD.

The conductor layers 2B, 2B', and 2B'' are adjacent to the first main surface 1Ba of the resin film 1B. The conductor layers 2B, 2B', and 2B'' are also adjacent to a second main surface 1Cb of a resin film 1C described later.

The resin film 1B contains a thermoplastic resin.

The resin film 1B has voids 1Bh inside.

In the resin film with the conductor layer 10B, the voids 1Bh in the resin film 1B are localized between a first position EB1 and a second position EB2 such that voids between the first position EB1 and the second position EB2 are greater in number than voids between the second position EB2 and a third position EB3, wherein the first position EB1 refers to a position of an end surface, that is, the first main surface 1Ba of the resin film 1B facing the conductor layers 2B, 2B', and 2B'', the second position EB2 refers to a position distant from the first position EB1 by one-third of the thickness of the resin film 1B in the lamination direction, and the third position EB3 refers to a position distant from the second position EB2 by one-third of the thickness of the resin film 1B in a direction away from the first position EB1 in the lamination direction. Thus, in the resin film with the conductor layer 10B, the voids 1Bh are localized near the conductor layers 2B, 2B', and 2B''.

In the resin film with the conductor layer 10B, as illustrated in FIG. 7, the voids 1Bh in a cross section in the lamination direction and in an in-plane direction perpendicular to the lamination direction are preferably present along a main surface (the lower surface) of the conductor layers 2B, 2B', and 2B'' in the lamination direction and along the side surfaces (the left side surface and the right side surface) of the conductor layers 2B, 2B', and 2B'' in the in-plane direction.

The resin film with the conductor layer 10C includes a resin film 1C and a conductor layer 2C.

The resin film 1C has a first main surface 1Ca and a second main surface 1Cb facing each other in the thickness direction HD.

The conductor layer 2C is adjacent to the first main surface 1Ca of the resin film 1C.

The resin film 1C contains a thermoplastic resin.

The resin film 1C has voids 1Ch inside.

In the resin film with the conductor layer 10C, the voids 1Ch in the resin film 1C are localized between a first position EC1 and a second position EC2 such that voids between the first position EC1 and the second position EC2 are greater in number than voids between the second position EC2 and a third position EC3, wherein the first position EC1 refers to a position of an end surface, that is, the first main surface 1Ca of the resin film 1C facing the conductor layer 2C, the second position EC2 refers to a position distant from the first position EC1 by one-third of the thickness of the resin film 1C in the lamination direction, and the third position EC3 refers to a position distant from the second position EC2 by one-third of the thickness of the resin film 1C in a direction away from the first position EC1 in the lamination direction. Thus, in the resin film with the conductor layer 10C, the voids 1Ch are localized near the conductor layer 2C.

As illustrated in FIG. 7, the conductor layer 2B is preferably located at the interface between the resin film 1B and the resin film 1C. This shifts the interface between the conductor layer 2B and the resin film 1B and the interface between the conductor layer 2B and the resin film 1C from the interface between the resin film 1B and the resin film 1C in the lamination direction and thereby suppresses or prevents separation at the interface between the conductor layer 2B and the resin film 1B and at the interface between the conductor layer 2B and the resin film 1C.

Like the conductor layer 2B, the conductor layers 2B' and 2B'' are preferably located at the interface between the resin film 1B and the resin film 1C.

Although the interface between the resin film 1B and the resin film 1C is illustrated in FIG. 7, practically, the interface is not necessarily clear. When the interface between the resin film 1B and the resin film 1C is not clear, in a cross section in the lamination direction as illustrated in FIG. 7, a surface that passes through the center of a cross section of the conductor layer 2B in the lamination direction and extends in the in-plane direction perpendicular to the lamination direction is considered to be the interface between the resin film 1B and the resin film 1C.

In the multilayer substrate 50, the voids inside the resin films 1A, 1B, and 1C improve dielectric properties in a high-frequency region. Furthermore, when the resin films 1A, 1B, and 1C are liquid crystal polymer films, also due to the effects of the liquid crystal polymer, the multilayer substrate 50 has significantly improved dielectric properties in a high-frequency region.

As described above, in the resin film with the conductor layer 10A, the resin film with the conductor layer 10B, and the resin film with the conductor layer 10C, as in the resin film with the conductor layer 10, the voids are localized near the conductor layer. Thus, when the conductor layer is a signal line for transmitting a signal, as in a multilayer substrate produced by using the resin film with the conductor layer 10, the multilayer substrate 50 produced by using the resin film with the conductor layer 10A, the resin film with the conductor layer 10B, and the resin film with the conductor layer 10C has lower permittivity near the signal line, tends to have lower transmission loss in a high-frequency region, and consequently can easily have improved transmission characteristics in the high-frequency region.

When the first position, the second position, and the third position are defined as described above, the voids are preferably localized between the first position and the second position in all the resin film with the conductor layer 10A, the resin film with the conductor layer 10B, and the resin film with the conductor layer 10C. However, the voids may be localized between the first position and the second position in some of the resin films with the conductor layer. Thus, as long as the multilayer substrate 50 includes at least one resin film with a conductor layer in which voids are localized between the first position and the second position, the multilayer substrate 50 may include a resin film with a conductor layer in which voids are present in a region other than the region between the first position and the second position, or may include a resin film with a conductor layer in which voids are not present inside the resin film.

The preferred features of the resin film with the conductor layer 10A, the resin film with the conductor layer 10B, and the resin film with the conductor layer 10C are the same as the preferred features of the resin film with the conductor layer 10 described above. Thus, the preferred features of the resin films 1A, 1B, and 1C are the same as the preferred features of the resin film 1 described above.

The thicknesses of the resin films 1A, 1B, and 1C may be the same or different or may be partially different as illustrated in FIG. 7.

A constituent material of the conductor layers 2A, 2B, 2B', 2B", and 2C is, for example, copper, silver, aluminum, stainless steel, nickel, gold, or an alloy containing at least one of these metals, like a constituent material of the conductor layer 2.

Like the conductor layer 2, the conductor layers 2A, 2B, 2B', 2B", and 2C are formed of, for example, metal foil, preferably copper foil. A metal other than copper may be present on the surface of the copper foil.

The constituent materials of the conductor layers 2A, 2B, 2B', 2B", and 2C are preferably the same, may be different, or may be partially different.

The thicknesses of the conductor layers 2A, 2B, 2B', 2B", and 2C may be the same as illustrated in FIG. 7, may be different, or may be partially different.

As illustrated in FIG. 7, the multilayer substrate 50 preferably further includes interlayer connection conductors that extend through the resin films in the lamination direction and are connected to the conductor layers without extending through the conductor layers in the lamination direction.

The multilayer substrate 50 illustrated in FIG. 7 further includes interlayer connection conductors 20A, 20B, 20C, and 20D. The interlayer connection conductor 20A extends through the resin film 1B in the lamination direction and is connected to the conductor layer 2B' without extending through the conductor layer 2B' in the lamination direction. More specifically, the interlayer connection conductor 20A extends through the resin film 1B in the lamination direction and is connected to the conductor layer 2B' on the first main surface 1Ba of the resin film 1B. The interlayer connection conductor 20A is connected to the conductor layer 2A on the second main surface 1Bb of the resin film 1B. Thus, the conductor layer 2A is electrically connected to the conductor layer 2B' through the interlayer connection conductor 20A.

At a position distant from the interlayer connection conductor 20A, the interlayer connection conductor 20B extends through the resin film 1B in the lamination direction and is connected to the conductor layer 2B" without extending through the conductor layer 2B" in the lamination direction. More specifically, the interlayer connection conductor 20B extends through the resin film 1B in the lamination direction at a position distant from the interlayer connection conductor 20A and is connected to the conductor layer 2B" on the first main surface 1Ba of the resin film 1B. The interlayer connection conductor 20B is connected to the conductor layer 2A on the second main surface 1Bb of the resin film 1B at a position distant from the interlayer connection conductor 20A. Thus, the conductor layer 2A is electrically connected to the conductor layer 2B" through the interlayer connection conductor 20B.

The interlayer connection conductor 20C extends through the resin film 1C in the lamination direction and is connected to the conductor layer 2C without extending through the conductor layer 2C in the lamination direction. More specifically, the interlayer connection conductor 20C extends through the resin film 1C in the lamination direction and is connected to the conductor layer 2C on the first main surface 1Ca of the resin film 1C. The interlayer connection conductor 20C is connected to the conductor layer 2B' on the second main surface 1Cb of the resin film 1C. Thus, the conductor layer 2B' is electrically connected to the conductor layer 2C through the interlayer connection conductor 20C.

At a position distant from the interlayer connection conductor 20C, the interlayer connection conductor 20D extends through the resin film 1C in the lamination direction and is connected to the conductor layer 2C without extending through the conductor layer 2C in the lamination direction. More specifically, the interlayer connection conductor 20D extends through the resin film 1C in the lamination direction at a position distant from the interlayer connection conductor 20C and is connected to the conductor layer 2C on the first main surface 1Ca of the resin film 1C. The interlayer connection conductor 20D is connected to the conductor layer 2B" on the second main surface 1Cb of the resin film 1C at a position distant from the interlayer connection conductor 20C. Thus, the conductor layer 2B" is electrically connected to the conductor layer 2C through the interlayer connection conductor 20D.

Thus, in the multilayer substrate 50, the conductor layer 2A is electrically connected to the conductor layer 2C through the interlayer connection conductor 20A, the conductor layer 2B', and the interlayer connection conductor 20C. In the multilayer substrate 50, the conductor layer 2A is also electrically connected to the conductor layer 2C through the interlayer connection conductor 20B, the conductor layer 2B", and the interlayer connection conductor 20D.

The interlayer connection conductor 20A is formed, for example, by plating the inner wall of a via-hole, which extends through the resin film 1B in the thickness direction HD and reaches the conductor layer 2B' without extending through the conductor layer 2B' in the thickness direction HD, or by filling the via-hole with an electrically conductive paste and then performing heat treatment.

The interlayer connection conductors 20B, 20C, and 20D are also formed in the same manner as the interlayer connection conductor 20A except that they are formed at different positions.

When the interlayer connection conductors 20A, 20B, 20C, and 20D are formed by plating, a metal constituting each interlayer connection conductor is, for example, copper, tin, or silver, preferably copper.

When the interlayer connection conductors 20A, 20B, 20C, and 20D are formed by heat treatment of an electrically conductive paste, a metal contained in each interlayer connection conductor is, for example, copper, tin, or silver. Among these, each interlayer connection conductor preferably contains copper, more preferably copper and tin. For example, when the interlayer connection conductor 20A contains copper and tin, and the conductor layer 2B' is formed of copper foil, the interlayer connection conductor 20A causes an alloying reaction with the conductor layer 2B' at low temperatures. Thus, the interlayer connection conductor 20A is easily electrically connected to the conductor layer 2B'. The same applies to other combinations of the interlayer connection conductor and the conductor layer.

When the interlayer connection conductors 20A, 20B, 20C, and 20D are formed by heat treatment of an electrically conductive paste, a resin contained in each interlayer connection conductor preferably contains at least one thermosetting resin selected from the group consisting of epoxy resins, phenolic resins, polyimide resins, silicon resins and modified resins thereof, and acrylic resins, or at least one thermoplastic resin selected from the group consisting of polyamide resins, polystyrene resins, polymethacrylate resins, polycarbonate resins, and cellulose resins.

The multilayer substrate 50 is used as an electronic circuit board, for example.

In the multilayer substrate 50, the conductor layer 2B may be a signal line for transmitting a signal. Thus, the multilayer substrate 50 may include the conductor layer 2B as a signal line for transmitting a signal. In such a case, the multilayer substrate 50 constitutes a transmission line.

When the conductor layer 2B is a signal line for transmitting a signal in the multilayer substrate 50, as illustrated in FIG. 7, the voids 1Bh in a cross section in the lamination direction and in an in-plane direction perpendicular to the lamination direction are preferably present along a main surface (the lower surface) of the conductor layer 2B in the lamination direction and along the side surfaces (the left side surface and the right side surface) of the conductor layer 2B in the in-plane direction.

When the conductor layer 2B transmits a signal as a signal line, an electric field tends to concentrate on the corners of the conductor layer 2B. The voids 1Bh present along the main surface of the conductor layer 2B in the lamination direction and along the side surfaces of the conductor layer 2B in the in-plane direction cover the corners of the conductor layer 2B and therefore easily reduce transmission loss in a high-frequency region, consequently easily improving transmission characteristics in the high-frequency region.

The multilayer substrate 50 may have the conductor layer 2B as a signal line for transmitting a signal and may also have the conductor layer 2A and the conductor layer 2C as ground electrodes. In such a case, the multilayer substrate 50 constitutes a strip-line transmission line.

When the multilayer substrate 50 constitutes the transmission line described above, the conductor layer 2B may be a signal line for transmitting a high-frequency signal.

When the multilayer substrate 50 constitutes the transmission line, the voids 1Bh localized near the conductor layer 2B, that is, near the signal line reduce permittivity in the vicinity of the signal line. Thus, when the multilayer substrate 50 constitutes the transmission line, the multilayer substrate 50 tends to have lower transmission loss in a high-frequency region and consequently can easily have improved transmission characteristics in the high-frequency region.

The multilayer substrate 50 is produced by the following method, for example.

<Step of Producing Resin Film with Conductor Layer>

Figure 8:
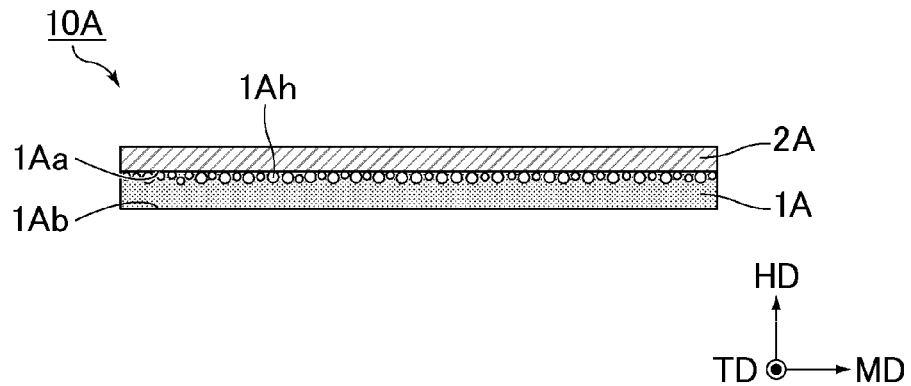
FIG. 8 is a schematic cross-sectional view of the step of producing a resin film with a conductor layer in an example of a method for producing a multilayer substrate according to the present invention.
Figure 9:
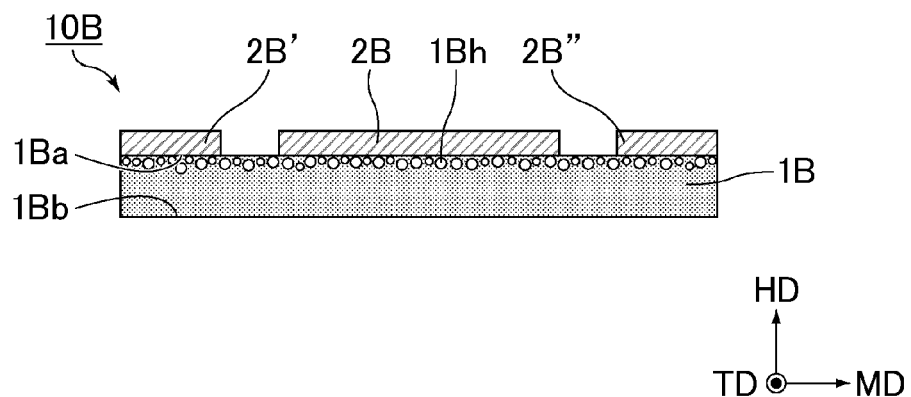
FIG. 9 is a schematic cross-sectional view of the step of producing a resin film with a conductor layer in an example of a method for producing a multilayer substrate according to the present invention.
Figure 10:
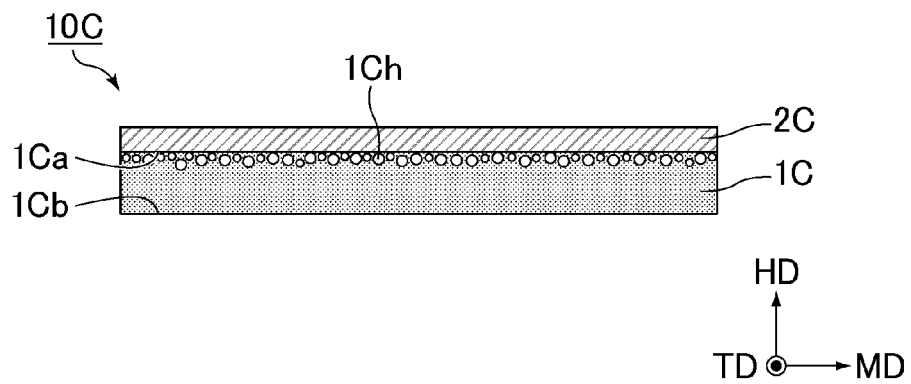
FIG. 10 is a schematic cross-sectional view of the step of producing a resin film with a conductor layer in an example of a method for producing a multilayer substrate according to the present invention.

FIGS. 8, 9, and 10 are schematic cross-sectional views of the step of producing a resin film with a conductor layer in an example of a method for producing a multilayer substrate according to the present invention.

As illustrated in FIG. 8, the resin film with the conductor layer 10A including the conductor layer 2A adjacent to the first main surface 1Aa of the resin film 1A is prepared.

The resin film with the conductor layer 10A is prepared, for example, in the same manner as the resin film with the conductor layer 10. Thus, in the resin film with the conductor layer 10A, the voids 1Ah are localized near the conductor layer 2A.

As illustrated in FIG. 9, the resin film with the conductor layer 10B including the conductor layers 2B, 2B', and 2B" adjacent to the first main surface 1Ba of the resin film 1B is prepared.

The resin film with the conductor layer 10B is prepared, for example, in the same manner as the resin film with the conductor layer 10. Thus, in the resin film with the conductor layer 10B, the voids 1Bh are localized near the conductor layers 2B, 2B', and 2B".

When the resin film with the conductor layer 10B is prepared, for example, the conductor layer is pressure-bonded to the first main surface 1Ba of the resin film 1B and is then patterned by etching into the conductor layers 2B, 2B', and 2B". Alternatively, the conductor layers 2B, 2B', and 2B" are prepared in advance and are pressure-bonded to the first main surface 1Ba of the resin film 1B.

As illustrated in FIG. 10, the resin film with the conductor layer 10C including the conductor layer 2C adjacent to the first main surface 1Ca of the resin film 1C is prepared.

The resin film with the conductor layer 10C is prepared, for example, in the same manner as the resin film with the conductor layer 10. Thus, in the resin film with the conductor layer 10C, the voids 1Ch are localized near the conductor layer 2C.

<Step of Forming Via-Hole>

Figure 11:
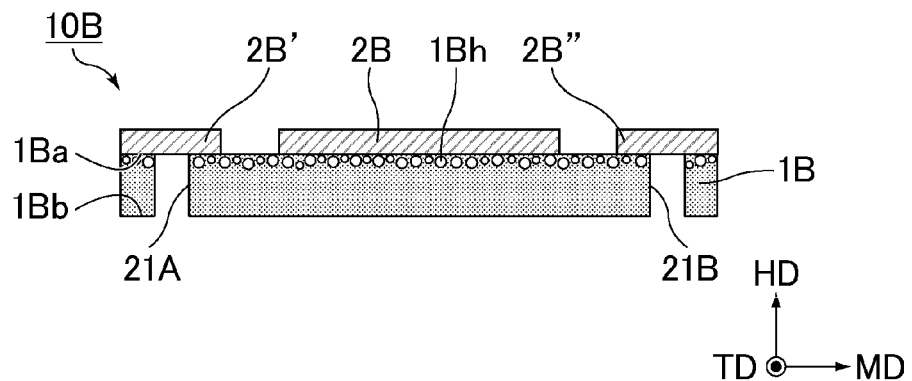
FIG. 11 is a schematic cross-sectional view of the step of forming a via-hole in an example of a method for producing a multilayer substrate according to the present invention.
Figure 12:
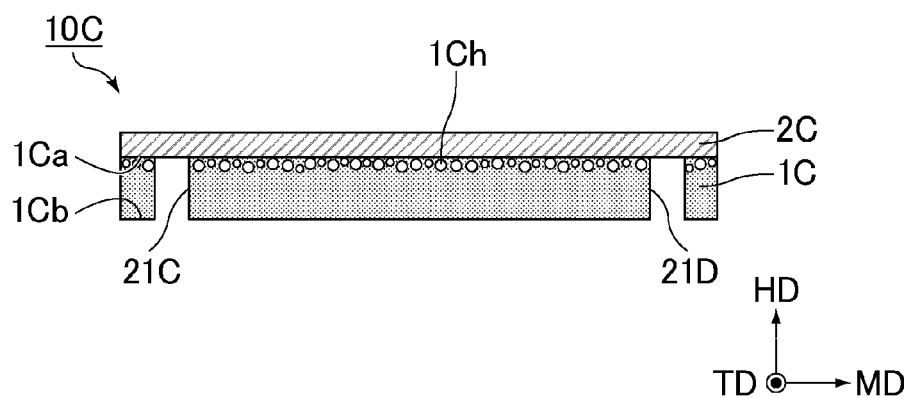
FIG. 12 is a schematic cross-sectional view of the step of forming a via-hole in an example of a method for producing a multilayer substrate according to the present invention.

FIGS. 11 and 12 are schematic cross-sectional views of the step of forming a via-hole in an example of a method for producing a multilayer substrate according to the present invention.

As illustrated in FIG. 11, a via-hole 21A is formed in the resin film with the conductor layer 10B so as to extend through the resin film 1B in the thickness direction HD and reach the conductor layer 2B' without extending through the conductor layer 2B' in the thickness direction HD. Thus, the conductor layer 2B' is partially exposed through the via-hole 21A.

At a position distant from the position at which the via-hole 21A is to be formed, a via-hole 21B is formed in the resin film with the conductor layer 10B so as to extend through the resin film 1B in the thickness direction HD and reach the conductor layer 2B" without extending through the conductor layer 2B" in the thickness direction HD. Thus, the conductor layer 2B" is partially exposed through the via-hole 21B.

Thus, the via-holes 21A and 21B are formed in the resin film with the conductor layer 10B. The via-holes 21A and 21B may be formed at the same time point or at different time points.

As illustrated in FIG. 12, a via-hole 21C is formed in the resin film with the conductor layer 10C so as to extend through the resin film 1C in the thickness direction HD and reach the conductor layer 2C without extending through the conductor layer 2C in the thickness direction HD. Thus, the conductor layer 2C is partially exposed through the via-hole 21C.

At a position distant from the position at which the via-hole 21C is to be formed, a via-hole 21D is formed in the resin film with the conductor layer 10C so as to extend through the resin film 1C in the thickness direction HD and reach the conductor layer 2C without extending through the conductor layer 2C in the thickness direction HD. Thus, the conductor layer 2C is partially exposed through the via-hole 21D.

Thus, the via-holes 21C and 21D are formed in the resin film with the conductor layer 10C. The via-holes 21C and 21D may be formed at the same time point or at different time points.

When the via-holes 21A, 21B, 21C, and 21D are formed, a resin film with a conductor layer is preferably irradiated with a laser beam from the resin film side.

<Step of Filling Electrically Conductive Paste>

Figure 13:
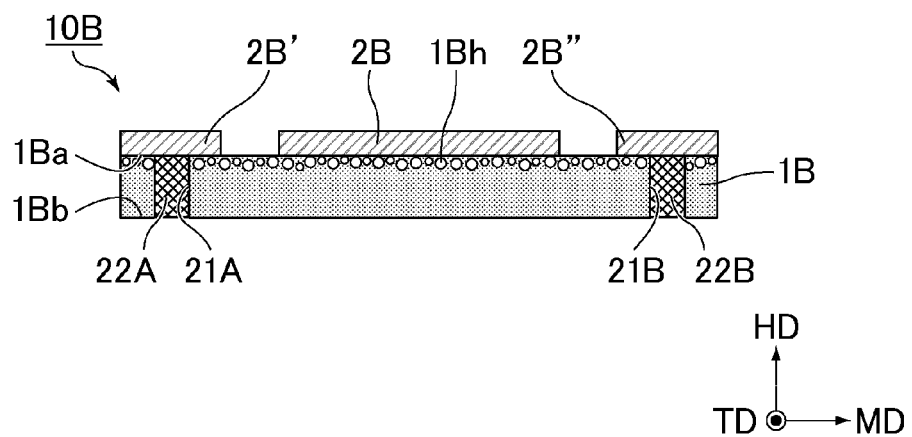
FIG. 13 is a schematic cross-sectional view of the step of applying an electrically conductive paste in an example of a method for producing a multilayer substrate according to the present invention.
Figure 14:
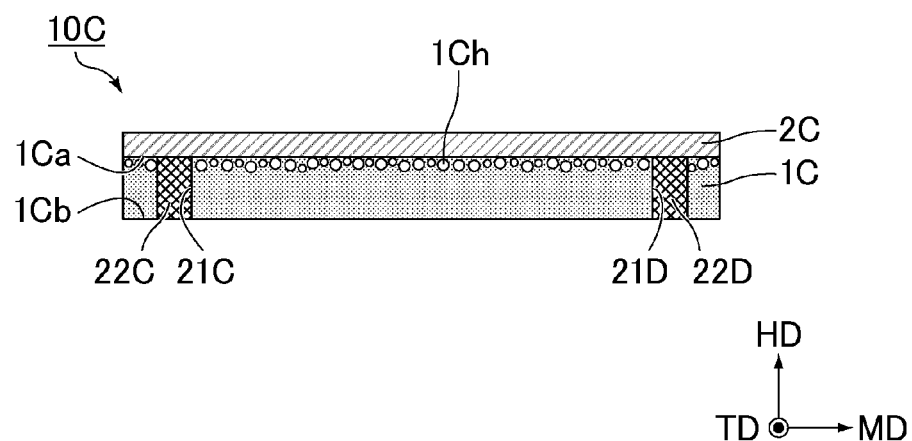
FIG. 14 is a schematic cross-sectional view of the step of applying an electrically conductive paste in an example of a method for producing a multilayer substrate according to the present invention.

FIGS. 13 and 14 are schematic cross-sectional views of the step of applying an electrically conductive paste in an example of a method for producing a multilayer substrate according to the present invention.

As illustrated in FIG. 13, the via-hole 21A in the resin film with the conductor layer 10B is filled with an electrically conductive paste 22A. The via-hole 21B in the resin film with the conductor layer 10B is filled with an electrically conductive paste 22B. The electrically conductive pastes 22A and 22B may be applied at the same time point or at different time points.

As illustrated in FIG. 14, the via-hole 21C in the resin film with the conductor layer 10C is filled with an electrically conductive paste 22C. The via-hole 21D in the resin film with the conductor layer 10C is filled with an electrically conductive paste 22D. The electrically conductive pastes 22C and 22D may be applied at the same time point or at different time points.

The electrically conductive pastes 22A, 22B, 22C, and 22D are applied, for example, by a screen printing method or a vacuum filling method.

Each of the electrically conductive pastes 22A, 22B, 22C, and 22D contains a metal and a resin, for example.

Examples of the metal contained in each of the electrically conductive pastes 22A, 22B, 22C, and 22D include copper, tin, and silver. Among these, each electrically conductive paste preferably contains copper, more preferably copper and tin.

The resin contained in each of the electrically conductive pastes 22A, 22B, 22C, and 22D preferably includes at least one thermosetting resin selected from the group consisting of epoxy resins, phenolic resins, polyimide resins, silicon resins and modified resins thereof, and acrylic resins, or at least one thermoplastic resin selected from the group consisting of polyamide resins, polystyrene resins, polymethacrylate resins, polycarbonate resins, and cellulose resins.

Each of the electrically conductive pastes 22A, 22B, 22C, and 22D may further contain a vehicle, a solvent, a thixotropic agent, an activator, and the like.

The vehicle is, for example, a rosin resin composed of rosin or a derivative of rosin, such as a modified rosin, a synthetic resin composed of rosin or a derivative of rosin, such as a modified rosin, or a mixture of these resins.

Examples of the rosin resin composed of rosin or a derivative of rosin, such as a modified rosin, include gum rosin, tall oil rosin, wood rosin, polymerized rosin, hydrogenated rosin, formylated rosin, rosin esters, rosin-modified maleic acid resins, rosin-modified phenolic resins, rosin-modified alkyd resins, and various rosin derivatives.

Examples of the synthetic resin composed of rosin or a derivative of rosin, such as a modified rosin, include polyester resins, polyamide resins, phenoxy resins, and terpene resins.

Examples of the solvent include alcohols, ketones, esters, ethers, aromatics, and hydrocarbons. Specific examples of these include benzyl alcohol, ethanol, isopropyl alcohol, butanol, diethylene glycol, ethylene glycol, glycerin, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethyl-hexanediol, toluene, xylene, propylene glycol monophenyl ether, diethylene glycol monohexyl ether, ethylene glycol monobutyl ether, diethylene glycol monobutyl ether, diethylene glycol monoethyl ether, diisobutyl adipate, hexylene glycol, cyclohexane dimethanol, 2-terpinyloxyethanol, 2-dihydroterpinyloxyethanol, and mixtures thereof. Among these, terpineol, ethylene glycol monobutyl ether, diethylene glycol monobutyl ether, and diethylene glycol monoethyl ether are preferred.

Examples of the thixotropic agent include hydrogenated castor oil, carnauba wax, amides, hydroxy fatty acids, dibenzylidene sorbitol, bis(p-methylbenzylidene)sorbitol, beeswax, stearamide, and hydroxystearic acid ethylenebisamide. If necessary, the thixotropic agent may further contain a fatty acid, such as caprylic acid, lauric acid, myristic acid, palmitic acid, stearic acid, or behenic acid, a hydroxy fatty acid, such as 1,2-hydroxystearic acid, an antioxidant, a surfactant, or an amine.

Examples of the activator include amine hydrohalides, organic halides, organic acids, organic amines, and polyhydric alcohols.

Examples of the amine hydrohalides include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

Examples of the organic halides include chlorinated paraffins, tetrabromoethane, dibromopropanol, 2,3-dibromo-1,4-butanediol, 2,3-dibromo-2-butene-1,4-diol, and tris(2,3-dibromopropyl)isocyanurate.

Examples of the organic acids include malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid.

Examples of the organic amines include monoethanolamine, diethanolamine, triethanolamine, tributylamine, aniline, and diethylaniline.

Examples of the polyhydric alcohols include erythritol, pyrogallol, and ribitol.

<Step of Forming Interlayer Connection Conductor>

Figure 15:
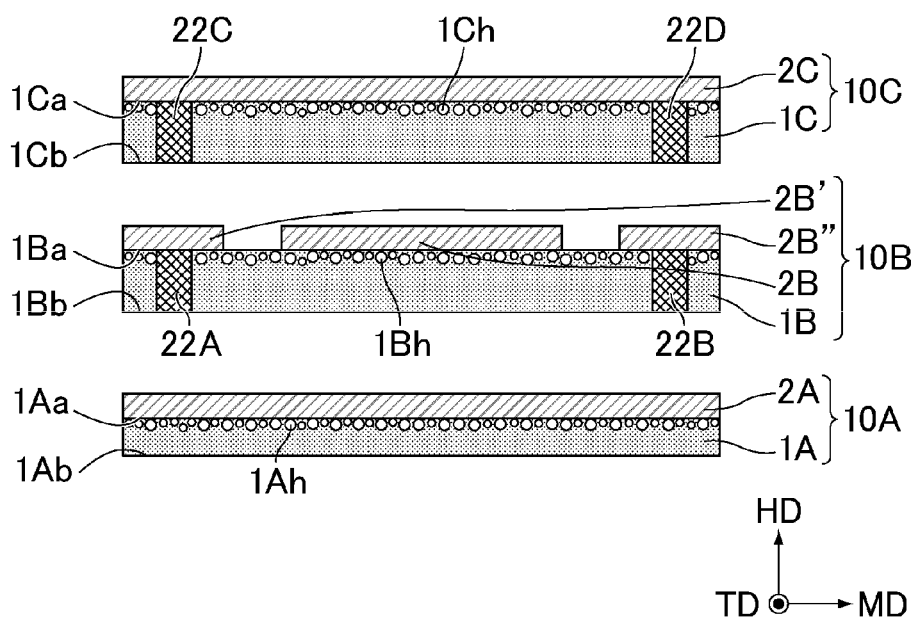
FIG. 15 is a schematic cross-sectional view of the step of forming an interlayer connection conductor in an example of a method for producing a multilayer substrate according to the present invention.

FIG. 15 is a schematic cross-sectional view of the step of forming an interlayer connection conductor in an example of a method for producing a multilayer substrate according to the present invention.

As illustrated in FIG. 15, the resin film with the conductor layer 10A, the resin film with the conductor layer 10B filled with the electrically conductive pastes 22A and 22B, and the resin film with the conductor layer 10C filled with the electrically conductive pastes 22C and 22D are laminated in order in the lamination direction. The resin films are laminated such that the surface (upper surface) of the conductor layer 2A of the resin film with the conductor layer 10A is in contact with the surface (lower surface) of the resin film 1B of the resin film with the conductor layer 10B, and the surface (upper surface) of the conductor layer 2B (the conductor layers 2B' and 2B") of the resin film with the conductor layer 10B is in contact with the surface (lower surface) of the resin film 1C of the resin film with the conductor layer 10C. In FIG. 15, for convenience of description, the resin films with the conductor layer are separated from each other.

The multilayer body is heated and pressed in the lamination direction for hot pressing. Thus, the resin film with the conductor layer 10A and the resin film with the conductor layer 10B are pressure-bonded together, and the resin film with the conductor layer 10B and the resin film with the conductor layer 10C are pressure-bonded together.

When the resin film with the conductor layer 10B and the resin film with the conductor layer 10C are pressure-bonded together, the conductor layers 2B, 2B', and 2B" are pressed into the resin film 1B because the resin film 1B contains a thermoplastic resin. Thus, the voids 1Bh also move together with the conductor layers 2B, 2B', and 2B" and surround the main surface of the conductor layers 2B, 2B', and 2B" in the lamination direction and the side surfaces of the conductor layers 2B, 2B', and 2B" in the in-plane direction. Thus, the structure in which the voids 1Bh are present along the main surface of the conductor layers 2B, 2B', and 2B" in the lamination direction and along the side surfaces of the conductor layers 2B, 2B', and 2B" in the in-plane direction is formed by a simultaneous lamination method using the resin film with the conductor layer 10B in which the resin film 1B containing a thermoplastic resin contains the voids 1Bh, more specifically, by simultaneously laminating the resin film with the conductor layer 10B and the resin film with the conductor layer 10C.

The electrically conductive pastes 22A, 22B, 22C, and 22D are solidified during hot pressing into the interlayer connection conductors 20A, 20B, 20C, and 20D, respectively. In this manner, the interlayer connection conductors 20A, 20B, 20C, and 20D are formed in the via-holes 21A, 21B, 21C, and 21D, respectively.

When the interlayer connection conductors 20A, 20B, 20C, and 20D are formed, the inner walls of the via-holes may be plated with a metal, such as copper, tin, or silver, instead of filling the via-holes with an electrically conductive paste.

Thus, the multilayer substrate 50 illustrated in FIG. 7 is produced.

A multilayer substrate according to the present invention may further include a side surface conductor on a side surface extending in the lamination direction.

Figure 16:
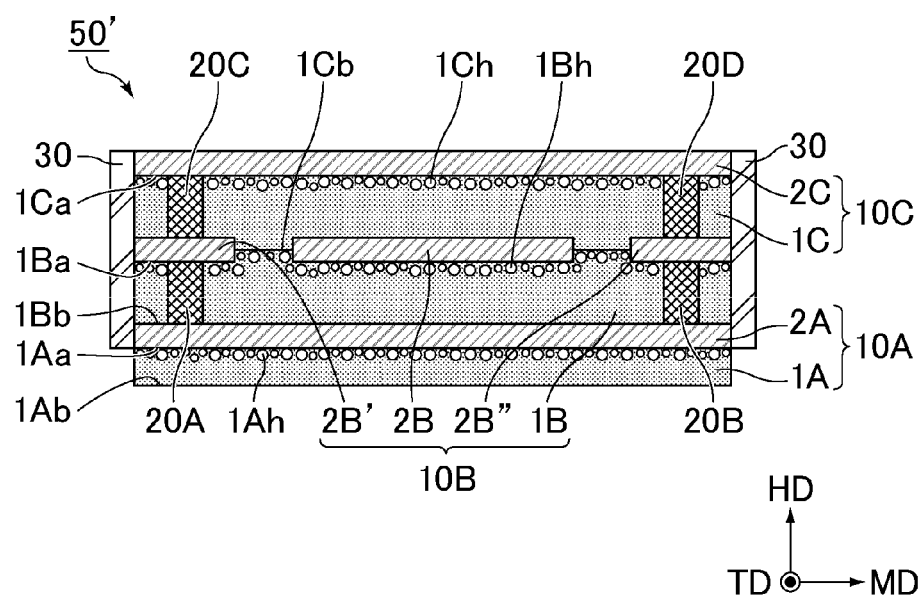
FIG. 16 is a schematic cross-sectional view of an example of a multilayer substrate according to the present invention, which is different from the example of FIG. 7.

FIG. 16 is a schematic cross-sectional view of an example of a multilayer substrate according to the present invention, which is different from the example of FIG. 7.

The multilayer substrate 50' illustrated in FIG. 16 further includes a side surface conductor 30 on the side surfaces in the lamination direction, in addition to the structure of the multilayer substrate 50 illustrated in FIG. 7.

The side surface conductors 30 can function as shield electrodes for shielding electromagnetic waves. The multilayer substrate 50' including the side surface conductors 30 easily has improved electromagnetic shielding properties on the side surfaces thereof.

The side surface conductors 30 are preferably connected to the conductor layers. In the multilayer substrate 50' illustrated in FIG. 16, the side surface conductors 30 are connected to the conductor layers 2A, 2B', 2B", and 2C. Thus, when the conductor layer 2A and the conductor layer 2C function as the ground electrodes as described above, the side surface conductors 30 function not only as the shield electrodes but also as the ground electrodes.

The side surface conductors 30 are composed of copper, tin, or silver, for example.

The side surface conductors 30 are formed, for example, by plating the side surfaces of a multilayer body of resin films with a conductor layer with a metal, such as copper, tin, or silver, by sputtering or the like.

The multilayer substrate 50' includes the interlayer connection conductors 20A, 20B, 20C, and 20D in addition to the side surface conductors 30 but does not necessarily include these interlayer connection conductors.

A multilayer substrate according to the present invention may include three resin films with a conductor layer as in the multilayer substrate 50 illustrated in FIG. 7 and the multilayer substrate 50' illustrated in FIG. 16 or may include only one resin film with a conductor layer.

Figure 17:
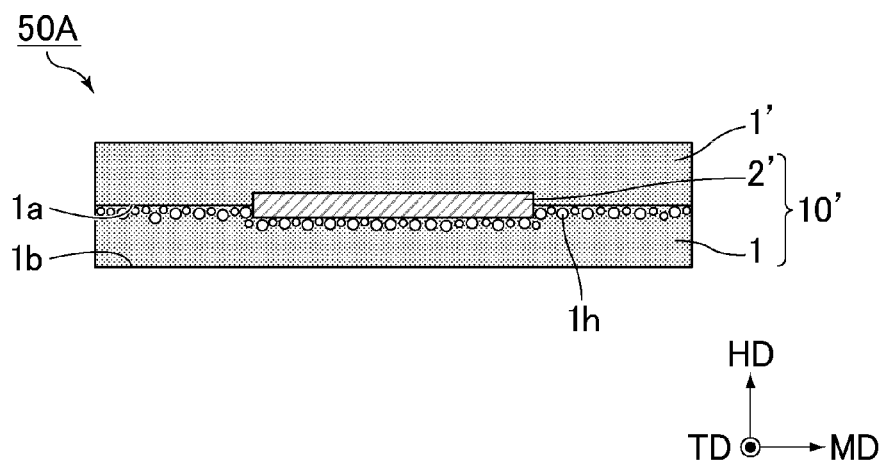
FIG. 17 is a schematic cross-sectional view of an example of a multilayer substrate according to the present invention, which is different from the examples of FIGS. 7 and 16.

FIG. 17 is a schematic cross-sectional view of an example of a multilayer substrate according to the present invention, which is different from the examples of FIGS. 7 and 16.

The multilayer substrate 50A illustrated in FIG. 17 includes the resin film with the conductor layer 10' illustrated in FIG. 5 and the resin film 1' in the lamination direction.

The resin film 1' is in contact with the surface (upper surface) of the resin film with the conductor layer 10' on the side of the conductor layer 2', which includes part of the first main surface 1a of the resin film 1.

As illustrated in FIG. 17, the voids 1h in a cross section of the multilayer substrate 50A in the lamination direction and in an in-plane direction perpendicular to the lamination direction are preferably present along a main surface (the lower surface) of the conductor layer 2' in the lamination direction and along the side surfaces (the left side surface and the right side surface) of the conductor layer 2' in the in-plane direction.

Figure 18:
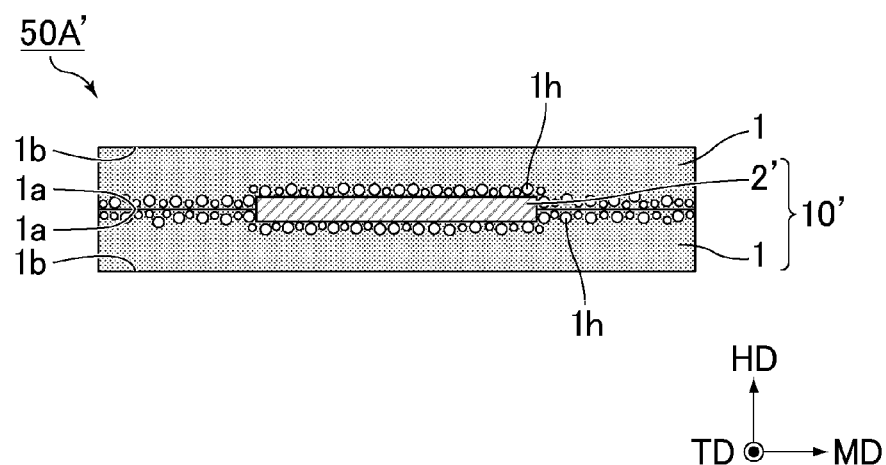
FIG. 18 is a schematic cross-sectional view of an example of a multilayer substrate according to the present invention, which is different from the examples of FIGS. 7, 16, and 17.

FIG. 18 is a schematic cross-sectional view of an example of a multilayer substrate according to the present invention, which is different from the examples of FIGS. 7, 16, and 17.

The multilayer substrate 50A' illustrated in FIG. 18 includes the resin film with the conductor layer 10' illustrated in FIG. 5 and another resin film 1 different from the resin film 1 of the resin film with the conductor layer 10' in the lamination direction.

The two resin films 1 are laminated in the lamination direction such that the first main surfaces 1a of the two resin films 1 are in contact with each other.

As illustrated in FIG. 18, the voids 1h in a cross section of the multilayer substrate 50A' in the lamination direction and in an in-plane direction perpendicular to the lamination direction are preferably present along a main surface (the lower surface) and another main surface (the upper surface)

of the conductor layer 2' in the lamination direction and along the side surfaces (the left side surface and the right side surface) of the conductor layer 2' in the in-plane direction.

The multilayer substrate 50A' is produced as described below, for example. First, two resin films with a conductor layer 10' are prepared. The conductor layer 2' of one of the resin films with the conductor layer 10' is etched to take out the resin film 1. The resin film 1 taken out from one of the resin films with the conductor layer 10' and the other resin film with a conductor layer 10' are then laminated in the lamination direction such that the first main surfaces 1a of the resin films 1 are in contact with each other. Thus, the multilayer substrate 50A' is produced.

In the method for producing the multilayer substrate 50A', although the conductor layer 2' of the resin film with the conductor layer 10' was etched to take out and prepare the resin film 1 with the voids 1h to be laminated on the resin film with the conductor layer 10', the resin film 1 with the voids 1h may be simply used.

In the multilayer substrate 50A' produced as described above, as illustrated in FIG. 18, the voids 1h are present along the first main surfaces 1a of the resin films 1, the main surfaces (the lower surface and the upper surface) of the conductor layer 2' in the lamination direction, and the side surfaces (the left side surface and the right side surface) of the conductor layer 2' in the in-plane direction.

A multilayer substrate according to the present invention may include two resin films with a conductor layer.

Figure 19:
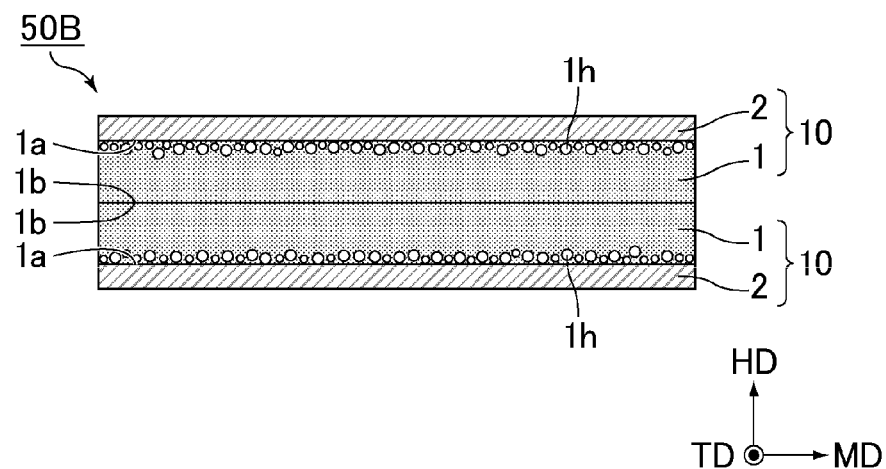
FIG. 19 is a schematic cross-sectional view of an example of a multilayer substrate according to the present invention, which is different from the examples of FIGS. 7, 16, 17, and 18.

FIG. 19 is a schematic cross-sectional view of an example of a multilayer substrate according to the present invention, which is different from the examples of FIGS. 7, 16, 17, and 18.

A multilayer substrate 50B illustrated in FIG. 19 includes two resin films with a conductor layer 10 illustrated in FIG. 1 in the lamination direction.

The two resin films with a conductor layer 10 are laminated in the lamination direction such that the second main surfaces 1b of the resin films 1 are in contact with each other.

Although a multilayer substrate according to the present invention including only one resin film with a conductor layer, two resin films with a conductor layer, or three resin films with a conductor layer are exemplified above, a multilayer substrate according to the present invention may include four or more resin films with a conductor layer.

In a multilayer substrate according to the present invention, the resin film may be plastically deformed. In a multilayer substrate according to the present invention, the resin film contains a thermoplastic resin and can therefore be plastically deformed by heat, for example.

In a multilayer substrate according to the present invention, when the resin film is plastically deformed, the resin film and the conductor layer may be integrally bent. In a known multilayer substrate with voids inside a resin film, such as a multilayer circuit board described in Patent Document 1, integrally bending the resin film and a conductor layer may cause a crack from the voids. In contrast, in a multilayer substrate according to the present invention, voids are localized near a conductor layer, and integrally bending a resin film and the conductor layer is therefore less likely to cause a crack from the voids.

EXAMPLES

Examples of a resin film with a conductor layer according to the present invention are more specifically disclosed below. However, the present invention is not limited to these examples.

The following liquid crystal polymers A, B, C, and D were prepared as thermoplastic resins.

<Liquid Crystal Polymer A>

A type II wholly aromatic polyester, which was a copolymer of 75% by mole of 6-hydroxy-2-naphthoic acid and 25% by mole of p-hydroxybenzoic acid and had a melting point of 320° C. and a melt viscosity of 111 Pa·s, was prepared as the liquid crystal polymer A.

<Liquid Crystal Polymer B>

A type II wholly aromatic polyester, which was a copolymer of 75% by mole of 6-hydroxy-2-naphthoic acid and 25% by mole of p-hydroxybenzoic acid and had a melting point of 320° C. and a melt viscosity of 74 Pa·s, was prepared as the liquid crystal polymer B.

<Liquid Crystal Polymer C>

A type II wholly aromatic polyester, which was a copolymer of 20% by mole of 6-hydroxy-2-naphthoic acid and 80% by mole of p-hydroxybenzoic acid and had a melting point of 325° C. and a melt viscosity of 98 Pa·s, was prepared as the liquid crystal polymer C.

<Liquid Crystal Polymer D>

A type II wholly aromatic polyester, which was a copolymer of 75% by mole of 6-hydroxy-2-naphthoic acid and 25% by mole of p-hydroxybenzoic acid and had a melting point of 320° C. and a melt viscosity of 79 Pa·s, was prepared as the liquid crystal polymer D.

The melt viscosities of the liquid crystal polymers A, B, C, and D were measured at a temperature of 330° C. and a shear rate of 1000 $s^{-1}$.

Example 1

A liquid crystal polymer film with a conductor layer according to Example 1 was produced by the following method.

<Step of Producing Multilayer Body>

First, a liquid crystal polymer film was prepared from a resin material containing liquid crystal polymers at a blending ratio shown in Table 1 by a known film forming method described above.

One main surface of the liquid crystal polymer film was a rough surface with irregularities. The arithmetic mean height Sa of a main surface of the liquid crystal polymer film on which a conductor layer is to be formed was measured by the method using the non-contact laser microscope described above. Table 1 shows the results.

A copper foil "WS" manufactured by Furukawa Electric Co., Ltd. was prepared as a conductor layer.

The conductor layer was then pressure-bonded to one main surface of the liquid crystal polymer film to produce a multilayer body including the liquid crystal polymer film and the conductor layer in the lamination direction. In the multilayer body, one main surface of the liquid crystal polymer film was a rough surface, and a space was formed between the liquid crystal polymer film and the conductor layer in the in-plane direction.

<Step of Forming Voids>

The multilayer body was heat-treated to produce a liquid crystal polymer film with a conductor layer according to Example 1 having voids inside the liquid crystal polymer film.

Examples 2 to 7 and Comparative Example 1

Liquid crystal polymer films with a conductor layer according to Examples 2 to 7 and Comparative Example 1 were produced in the same manner as the liquid crystal polymer film with the conductor layer according to Example 1 except that a resin material containing liquid crystal polymers at a blending ratio shown in Table 1 was used.

"A", "B", "C", and "D" in Table 1 denote the liquid crystal polymers A, B, C, and D, respectively.

[Evaluation]

The liquid crystal polymer films with the conductor layer according to Examples 1 to 7 and Comparative Example 1 were examined as described below. Table 1 shows the results.

<$^{13}$C-NMR Spectrum>

First, a conductor layer of a liquid crystal polymer film with the conductor layer was etched to take out the liquid crystal polymer film.

Next, 5 g of the liquid crystal polymer film and 200 cc of methanol were put into a high-temperature and high-pressure reactor "MMJ-500" manufactured by OM Labotech. The high-temperature and high-pressure reactor was purged with argon and was then heated to 280° C. for 15 minutes to prepare a solution of the liquid crystal polymer film. Heating the system vaporized methanol, pressurized the system to the critical pressure of methanol, and brought the methanol in the system to a supercritical state. The solution was then dried under vacuum to remove the solvent and prepare a powder of a decomposition product of the liquid crystal polymer film decomposed with the supercritical methanol. Then, 0.014 g of the powder of the decomposition product of the liquid crystal polymer film was dissolved in 0.7 ml of deuterated methanol to prepare an NMR measurement sample.

A $^{13}$C-NMR spectrum of the NMR measurement sample was then measured with a Fourier transform nuclear magnetic resonance measuring apparatus "JNM-ECP600" manufactured by JEOL Ltd. An integral value CA of a peak derived from a benzene ring, an integral value CB of a peak derived from a naphthalene ring, and an integral value CC of a peak derived from a carboxymethyl group were then determined from the 13C-NMR spectrum.

A peak derived from a benzene ring, more specifically, a peak derived from methyl p-hydroxybenzoate was considered to be a peak with a chemical shift of 113 ppm to 115 ppm (114±1 ppm). A peak derived from a naphthalene ring, more specifically, a peak of methyl 6-hydroxy-2-naphthoate was considered to be a peak with a chemical shift of 107 ppm to 109 ppm (108±1 ppm). A peak derived from a carboxymethyl group, more specifically, a peak of a methyl group derived from an ester was considered to be a peak with a chemical shift of 49 ppm to 51 ppm (50±1 ppm).

(CA+CB)/CC was calculated from CA, CB, and CC thus determined.

<Viscoelastic Properties>

First, a conductor layer of a liquid crystal polymer film with the conductor layer was etched to take out the liquid crystal polymer film. A graph of the relationship between the loss tangent and the temperature of the liquid crystal polymer film was then obtained by measuring the temperature dependence of the loss tangent of the liquid crystal polymer film with a dynamic viscoelastometer "RSA-G2" manufactured by TA Instruments at a dynamic strain of 0.25%, at a frequency of 0.5 Hz, at a heating rate of 10° C./min, and in the temperature range of 40° C. to the melting point of the liquid crystal polymer contained in the liquid crystal polymer film. The integral value of loss tangent was calculated by integration from the graph of the relationship between the loss tangent and the temperature of the liquid crystal polymer film in the temperature range of 40° C. to the melting point of the thermoplastic resin contained in the liquid crystal polymer film.

The melting point of the thermoplastic resin contained in the liquid crystal polymer film was measured as described below. First, the liquid crystal polymer film was completely melted by heating at a heating rate of 20° C./min with a differential scanning calorimeter "DSC7000X" manufactured by Hitachi High-Tech Science Corporation. The melt was then cooled to 175° C. at a cooling rate of 20° C./min and was then heated again at a heating rate of 20° C./min. The temperature of an endothermic peak observed during the heating was defined as the melting point of the thermoplastic resin contained in the liquid crystal polymer film. When it was difficult to observe an endothermic peak by this method, the melting point of the thermoplastic resin contained in the liquid crystal polymer film was determined by texture observation with a polarizing microscope under crossed nicols conditions.

<Position of Voids>

The region where the liquid crystal polymer film overlapped the conductor layer in the liquid crystal polymer film with the conductor layer was viewed in cross section in the in-plane direction, and an image of a cross section in the lamination direction was taken with a scanning electron microscope. Such cross-sectional images were taken at five to ten different positions in the in-plane direction. All the captured cross-sectional images were subjected to image analysis using image analysis software to determine the positions of all voids in all the cross-sectional images of the liquid crystal polymer film, wherein a position of an end surface of the liquid crystal polymer film facing the conductor layer was defined as a first position, a position distant from the first position by one-third of the thickness of the liquid crystal polymer film in the lamination direction was defined as a second position, and a position distant from the second position by one-third of the thickness of the liquid crystal polymer film in a direction away from the first position in the lamination direction was defined as a third position. The criteria were as follows:

(good): Voids were present between the first position and the second position.

X (bad): Voids were not present between the first position and the second position but present between the second position and the third position, or no void were present.

<Number of Voids>

The region where voids were present in the liquid crystal polymer film of the liquid crystal polymer film with the conductor layer was confirmed in advance by viewing the liquid crystal polymer film in the thickness direction. The region between the first position and the second position was viewed in cross section in the in-plane direction, and an image of a cross section in the thickness direction was taken with a scanning electron microscope. In this manner, cross-sectional images of the region between the first position and the second position in the liquid crystal polymer film were taken at five to ten different positions in the in-plane direction. The size of one cross-sectional image was 75 μm in length×125 μm in width (for example, the size of a field viewed at a magnification of 1000 times). All the captured cross-sectional images were subjected to image analysis using image analysis software to count all the voids in all the cross-sectional images. The average value in one cross-sectional image (one field) calculated from the total number of voids was defined as the number of voids between the first position and the second position.

The number of voids between the second position and the third position was also defined in the same manner as the number of voids between the first position and the second position. When voids could not be observed in all the cross-sectional images (cross-sectional images at five to ten positions) taken in the region between the second position and the third position in the liquid crystal polymer film, the number of voids between the second position and the third position was considered to be zero.

<Diameter of Voids>

The region where voids were present in the liquid crystal polymer film of the liquid crystal polymer film with the conductor layer was confirmed in advance by viewing the liquid crystal polymer film in the thickness direction. The region between the first position and the second position was viewed in cross section in the in-plane direction, and an image of a cross section in the thickness direction was taken with a scanning electron microscope. In this manner, cross-sectional images of the region between the first position and the second position in the liquid crystal polymer film were taken at five to ten different positions in the in-plane direction. The size of one cross-sectional image was 75 μm in length×125 μm in width (for example, the size of a field viewed at a magnification of 1000 times). All the captured cross-sectional images were subjected to image analysis using image analysis software to determine the equivalent circular diameter of each void in all the cross-sectional images. The maximum value of the diameters thus determined was defined as the diameter of the voids present between the first position and the second position.

<Porosity>

The main surface of the liquid crystal polymer film of the liquid crystal polymer film with the conductor layer facing the conductor layer was viewed from the top in the thickness direction, and an image of a plane in the in-plane direction was taken with an optical microscope at a magnification of 100 times. The captured planar image was then subjected to image analysis using image analysis software to determine the area ratio of voids per 10-mm square region in the planar image, and the determined value was defined as the porosity between the first position and the second position.

TABLE 1

| | Blending ratio of liquid crystal polymers (% by weight) | | | | Arithmetic mean height Sa (nm) | $^{13}$C-NMR spectrum (CA + CB)/CC | Viscoelastic properties Integral value of loss tangent |
|---|---|---|---|---|---|---|---|
| | A | B | C | D | | | |
| Example 1 | 0 | 100 | 0 | 0 | 274 | 1.25 | 25.7 |
| Example 2 | 90 | 0 | 10 | 0 | 191 | 1.37 | 28.2 |
| Example 3 | 90 | 0 | 10 | 0 | 218 | 1.37 | 28.1 |
| Example 4 | 90 | 0 | 10 | 0 | 240 | 1.37 | 28.7 |
| Example 5 | 90 | 0 | 10 | 0 | 290 | 1.37 | 27.1 |
| Example 6 | 90 | 0 | 10 | 0 | 342 | 1.37 | 28.7 |
| Example 7 | 0 | 0 | 25 | 75 | 274 | 1.62 | 29.7 |
| Comparative example 1 | 0 | 0 | 100 | 0 | 212 | 1.86 | 34.6 |

| | | Number of voids (—) | | | |
|---|---|---|---|---|---|
| | Position of voids | Between first position and second position | Between second position and third position | Diameter of voids (μm) | Porosity (% by area) |
| Example 1 | ○ | 6 | 0 | 18 | 0.20 |
| Example 2 | ○ | 7 | 0 | 18 | 0.22 |
| Example 3 | ○ | 7 | 0 | 18 | 0.22 |
| Example 4 | ○ | 8 | 0 | 18 | 0.44 |
| Example 5 | ○ | 12 | 2 | 18 | 1.23 |
| Example 6 | ○ | 20 | 2 | 18 | 2.13 |
| Example 7 | ○ | 15 | 2 | 18 | 2.00 |
| Comparative example 1 | x | — | — | — | — |

Table 1 shows that the liquid crystal polymer films with the conductor layer according to Examples 1 to 7 included voids localized between the first position and the second position and consequently localized near the conductor layer.

The reason why the liquid crystal polymer films with the conductor layer according to Examples 1 to 7 included voids near the conductor layer is probably that a liquid crystal polymer film with an integral value of loss tangent in viscoelastic properties of 29.7 or less, that is, a liquid crystal polymer film that had a small viscosity component of loss tangent in viscoelastic properties and that was not easily softened even at high temperatures was used in the production of the liquid crystal polymer films with the conductor layer according to Examples 1 to 7. It is thought that, due to the use of the liquid crystal polymer film with such characteristics in the production of the liquid crystal polymer films with the conductor layer according to Examples 1 to 7, even when the multilayer body was heat-treated in the step of forming voids described above, the gas contained in the space originating from the irregularities on one main surface of the liquid crystal polymer film was rarely released to the outside of the liquid crystal polymer film. Consequently, it is thought that, in the liquid crystal polymer films with the conductor layer according to Examples 1 to 7, the gas contained in the space was easily taken into the liquid crystal polymer film, and voids were easily formed in the liquid crystal polymer film, more specifically, near the conductor layer.

The number of voids and porosity between the first position and the second position were higher in the liquid crystal polymer films with the conductor layer according to Examples 4 to 7 than in the liquid crystal polymer films with the conductor layer according to Examples 2 and 3. This is probably due to the use of a liquid crystal polymer film with an arithmetic mean height Sa of 240 nm or more on the main surface on which the conductor layer was to be formed in the production of the liquid crystal polymer film with the conductor layer according to Examples 4 to 7.

In contrast, the liquid crystal polymer film with the conductor layer according to Comparative Example 1 did not have voids inside the liquid crystal polymer film.

The reason why the liquid crystal polymer film with the conductor layer according to Comparative Example 1 did not have voids inside the liquid crystal polymer film is that a liquid crystal polymer film whose integral value of loss tangent in viscoelastic properties was not 29.7 or less, that is, a liquid crystal polymer film that had a large viscosity component of loss tangent in viscoelastic properties and that was easily softened at high temperatures was used in the production of the liquid crystal polymer film with the conductor layer according to Comparative Example 1. It is thought that, due to the use of the liquid crystal polymer film with such characteristics in the production of the liquid crystal polymer film with the conductor layer according to Comparative Example 1, when the multilayer body was heat-treated in the step of forming voids described above, the irregularities on one main surface of the liquid crystal polymer film could not maintain their shapes, and the gas contained in the space originating from the irregularities was easily released to the outside of the liquid crystal polymer film. Consequently, it is thought that, in the liquid crystal polymer film with the conductor layer according to Comparative Example 1, the gas contained in the space was not easily taken into the liquid crystal polymer film, and voids were not formed in the liquid crystal polymer film.

REFERENCE SIGNS LIST 1, 1', 1", 1A, 1B, 1C resin film
1a, 1a", 1Aa, 1Ba, 1Ca first main surface of resin film
1b, 1b", 1Ab, 1Bb, 1Cb second main surface of resin film
1h, 1h", 1Ah, 1Bh, 1Ch void
2, 2', 2", 2A, 2B, 2B', 2B", 2C conductor layer
10, 10', 10", 10A, 10B, 10C resin film with a conductor layer
15 multilayer body
15h space
20A, 20B, 20C, 20D interlayer connection conductor
21A, 21B, 21C, 21D via-hole
22A, 22B, 22C, 22D electrically conductive paste
30 side surface conductor
50, 50', 50A, 50A', 50B multilayer substrate
E1, E1", EA1, EB1, EC1 first position
E2, E2", EA2, EB2, EC2 second position
E3, E3", EA3, EB3, EC3 third position
HD thickness direction
MD first direction
TD second direction

The invention claimed is:

1. A laminate structure comprising:
a resin film containing a thermoplastic resin and having a plurality of voids therein; and
a conductor layer adjacent to at least one main surface of the resin film,
wherein a first set of voids of the plurality of voids in the resin film are localized between a first position and a second position such that the first set of voids between the first position and the second position are greater in number than a second set of voids of the plurality of voids between the second position and a third position,
wherein the first position is proximal to an end surface of the resin film facing the conductor layer, the second position is distant from the first position by one-third of a thickness of the resin film in a lamination direction of the resin film and the conductor layer, and the third position is distant from the second position by one-third of the thickness of the resin film in a direction away from the first position in the lamination direction,
wherein the thermoplastic resin is a liquid crystal polymer,
wherein the liquid crystal polymer comprises a benzene ring, a naphthalene ring, and a carboxymethyl group, and
wherein, in a $^{13}$C-NMR spectrum of the resin film decomposed with supercritical methanol, an integral value CA of a peak derived from the benzene ring, an integral value CB of a peak derived from the naphthalene ring, and an integral value CC of a peak derived from the carboxymethyl group satisfy (CA+CB)/CC of 1.25 to 1.65.

2. The laminate structure according to claim 1, wherein the thermoplastic resin is a liquid crystal polymer.

3. The laminate structure according to claim 1, wherein the liquid crystal polymer comprises a benzene ring, a naphthalene ring, and a carboxymethyl group.

4. The laminate structure according to claim 1, wherein (CA+CB)/CC is 1.35 to 1.65.

5. The liquid crystal polymer film according to claim 1, wherein the integral value CA of the peak derived from the benzene ring is 1.05 to 1.80.

6. The liquid crystal polymer film according to claim 1, wherein the integral value CB of the peak derived from the naphthalene ring is 1.20 to 1.70.

7. The liquid crystal polymer film according to claim 1, wherein the integral value CC of the peak derived from the carboxymethyl group is 1.60 to 2.50.

8. The liquid crystal polymer film according to claim 1, wherein the integral value CA of the peak derived from the benzene ring is 1.05 to 1.80, the integral value CB of the peak derived from the naphthalene ring is 1.20 to 1.70, and the integral value CC of the peak derived from the carboxymethyl group is 1.60 to 2.50.

9. The laminate structure according to claim 1, wherein, in viscoelastic properties indicating a relationship between a loss tangent and a temperature of the resin film, an integral value of the loss tangent in a temperature range of 40° C. to a melting point of the thermoplastic resin contained in the resin film is 29.7 or less.

10. The laminate structure according to claim 1, wherein the first set of voids between the first position and the second position have a diameter of 20 μm or less.

11. The laminate structure according to claim 1, wherein the first set of voids between the first position and the second position have a diameter of 5 μm to 20 μm.

12. A multilayer substrate comprising the laminate structure according to claim 1.

13. The laminate structure according to claim 1, wherein a number of voids between the second position and the third position is one-fifth or less of a number of voids between the first position and the second position.

14. The multilayer substrate according to claim 12, wherein the conductor layer is a signal line, and the plurality of voids in a cross section in the lamination direction and in an in-plane direction perpendicular to the lamination direction are present along a main surface of the conductor layer in the lamination direction and along a side surface of the conductor layer in the in-plane direction.

15. The multilayer substrate according to claim 12, wherein the resin film is plastically deformed.

16. The multilayer substrate according to claim 15, wherein the resin film and the conductor layer are integrally bent.

* * * * *